United States Patent
Pandey et al.

(10) Patent No.: US 11,734,486 B2
(45) Date of Patent: Aug. 22, 2023

(54) SWEEPLINE TRIANGULATION FOR SPANNING GRAPHS

(71) Applicant: International Business Machines Corporation, Armonk, NY (US)

(72) Inventors: Diwesh Pandey, Jeevan Bhima Nagar (IN); Gustavo Enrique Tellez, Hyde Park, NY (US)

(73) Assignee: International Business Machines Corporation, Armonk, NY (US)

(*) Notice: Subject to any disclaimer, the term of this patent is extended or adjusted under 35 U.S.C. 154(b) by 227 days.

(21) Appl. No.: 17/467,631

(22) Filed: Sep. 7, 2021

(65) Prior Publication Data

US 2023/0075061 A1   Mar. 9, 2023

(51) Int. Cl.
  *G06F 30/00*  (2020.01)
  *G06F 30/394*  (2020.01)
  *G06F 16/901*  (2019.01)

(52) U.S. Cl.
  CPC ........ *G06F 30/394* (2020.01); *G06F 16/9024* (2019.01)

(58) Field of Classification Search
  CPC .......................... G06F 30/394; G06F 16/9024
  See application file for complete search history.

(56) References Cited

U.S. PATENT DOCUMENTS

| | | | |
|---|---|---|---|
| 6,438,266 B1* | 8/2002 | Bajaj | G06T 9/001 382/243 |
| 6,614,764 B1* | 9/2003 | Rodeheffer | H04L 45/02 370/254 |

(Continued)

FOREIGN PATENT DOCUMENTS

| | | |
|---|---|---|
| CN | 101661631 B | 5/2012 |
| CN | 109474476 A | 3/2015 |

(Continued)

OTHER PUBLICATIONS

Wikipedia, "Delaunay triangulation," https://en.wikipedia.org/wiki/Delaunay_triangulation#:~:text=In%20mathematics%20and%20computational%20geometry,triangle%20in%20DT(P), (Retrieved Aug. 25, 2021), 7 pages.

(Continued)

*Primary Examiner* — Naum Levin
(74) *Attorney, Agent, or Firm* — Cantor Colburn LLP; Erik Johnson

(57) ABSTRACT

Aspects of the invention include systems and methods for implementing a sweepline triangulation technique to optimize spanning graphs for circuit routing. A non-limiting example computer-implemented method includes receiving an unrouted net having a plurality of elements. The elements can include pins, vias, and wires. A sweepline is passed across the unrouted net until the sweepline intersects an element of the plurality of elements. In response to the sweepline intersecting the element, the sweepline is stopped and one or more nodes on the sweepline and one or more previous nodes are identified. A connectivity graph is built from the one or more nodes and the one or more previous nodes. The connectivity graph includes one or more arcs and one or more guides. A minimum spanning tree is built by removing one or more guides from the connectivity graph and the unrouted net is routed based on the minimum spanning tree.

20 Claims, 18 Drawing Sheets

(56) References Cited

U.S. PATENT DOCUMENTS

| | | | | |
|---|---|---|---|---|
| 6,792,587 | B2* | 9/2004 | Xing | G06F 30/394 |
| | | | | 716/129 |
| 6,944,841 | B1* | 9/2005 | Teig | G06F 30/394 |
| | | | | 716/113 |
| 7,100,129 | B1* | 8/2006 | Sal | G06F 30/394 |
| | | | | 716/105 |
| 7,117,468 | B1* | 10/2006 | Teig | G06F 30/394 |
| | | | | 716/129 |
| 7,137,097 | B1* | 11/2006 | Aji | G06F 30/394 |
| | | | | 716/134 |
| 8,117,569 | B1 | 2/2012 | Salowe | |
| 8,296,702 | B2* | 10/2012 | Mukherjee | G06F 30/39 |
| | | | | 716/110 |
| 8,543,944 | B2* | 9/2013 | Dwyer | G06T 11/206 |
| | | | | 715/854 |
| 9,954,765 | B2 | 4/2018 | Allan | |
| 10,063,460 | B2* | 8/2018 | Wu | H04W 40/22 |
| 10,102,328 | B1 | 10/2018 | Liu et al. | |
| 10,409,944 | B2* | 9/2019 | Siddiqi | G06F 30/394 |
| 10,916,055 | B2* | 2/2021 | Sunshine-Hill | G06T 17/20 |
| 11,620,768 | B2* | 4/2023 | Flynn | H04N 19/174 |
| | | | | 345/419 |
| 2011/0037838 | A1 | 12/2011 | Dwyer et al. | |
| 2018/0246309 | A1 | 8/2018 | Brown et al. | |
| 2018/0330258 | A1* | 11/2018 | Harris | G06N 7/01 |
| 2020/0242836 | A1* | 7/2020 | Sunshine-Hill | G06T 17/20 |
| 2023/0036710 | A1* | 2/2023 | Pandey | G06F 30/392 |
| 2023/0042059 | A1* | 2/2023 | Pandey | G06F 30/398 |

FOREIGN PATENT DOCUMENTS

| | | | | |
|---|---|---|---|---|
| CN | 111291525 | A * | 6/2020 | |
| CN | 112528592 | A * | 3/2021 | G06F 30/394 |
| CN | 115859899 | A * | 3/2023 | |
| EP | 3721586 | B1 * | 7/2022 | H04L 41/12 |

OTHER PUBLICATIONS

International Search Report; International Application No. PCT/CN2022/116131; International Filing Date: Aug. 31, 2022; dated Nov. 30, 2022; 9 pages.

Xie et al."Energy-Efficient Routing for Mobile Data Collectors in Wireless Sensor Networks with Obstacles" Springer Peer-to-Peer Networking and Applications, No. 3m vol. 10(2017):12 pages.

* cited by examiner

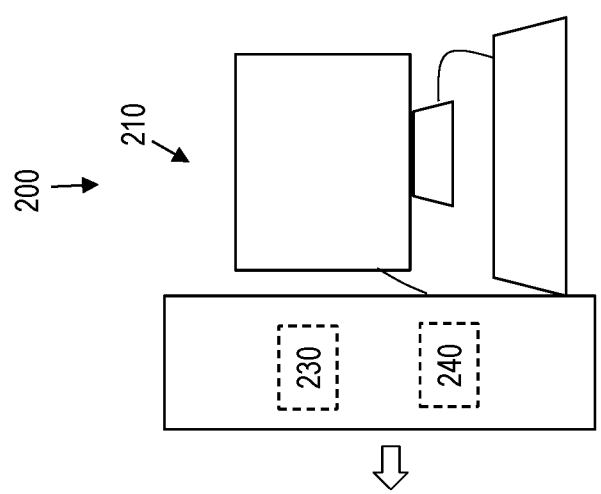
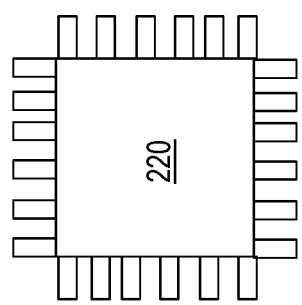
FIG. 2

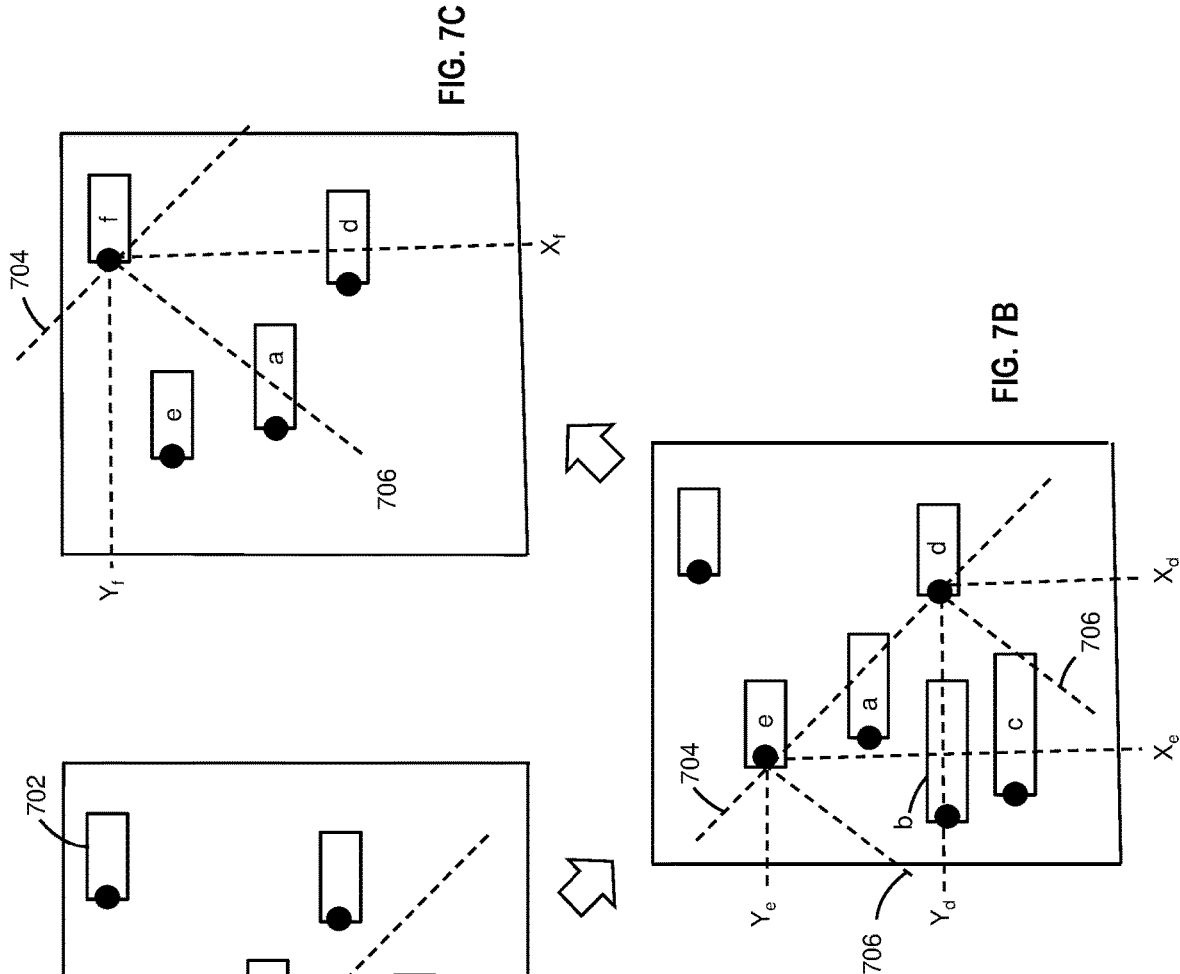

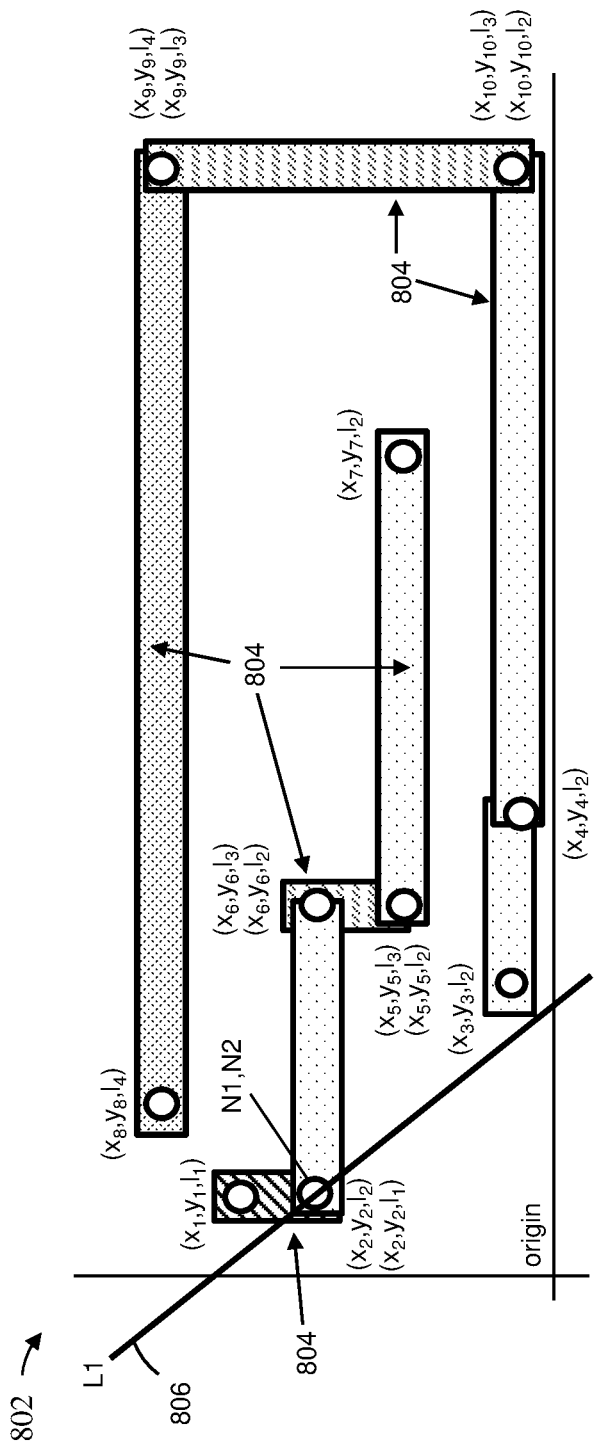
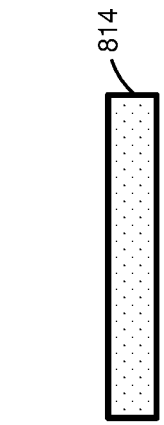
FIG. 8A
FIG. 8B
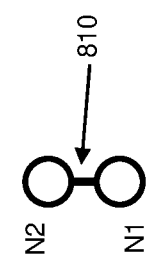
FIG. 8C

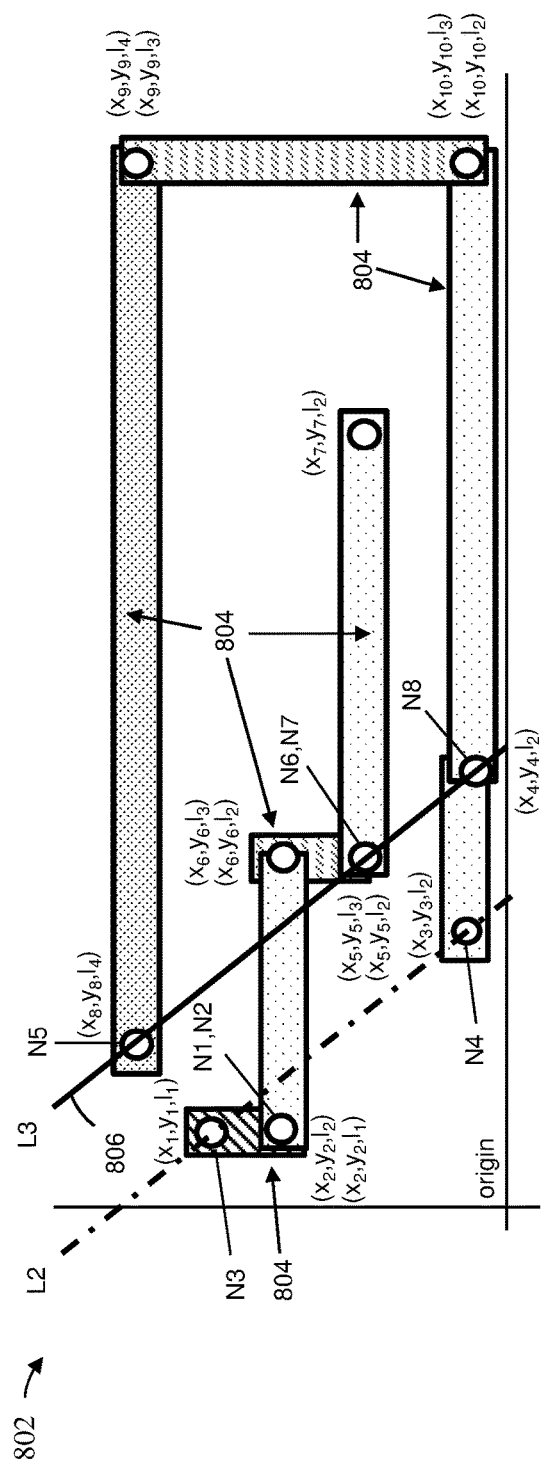
FIG. 10A
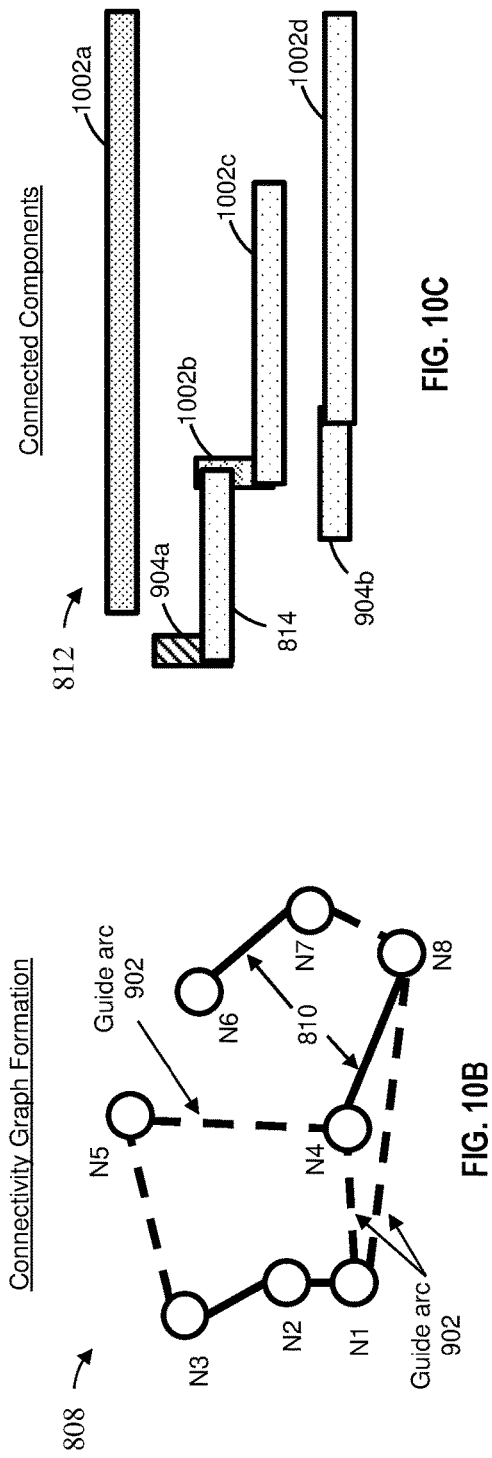
FIG. 10C
FIG. 10B

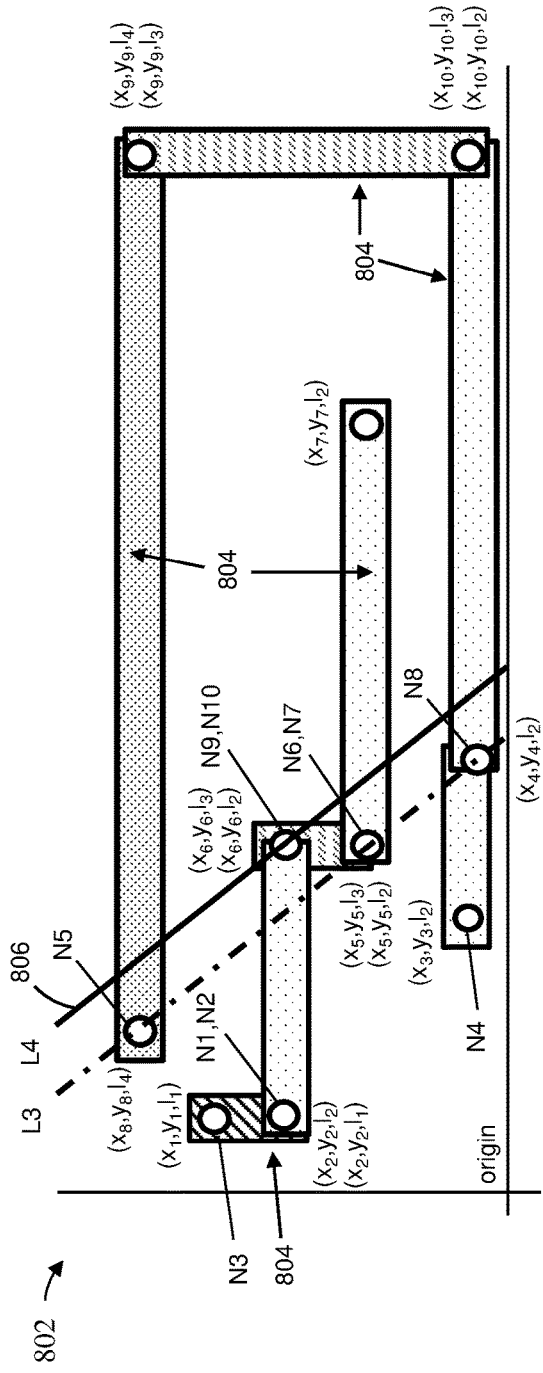
FIG. 11A
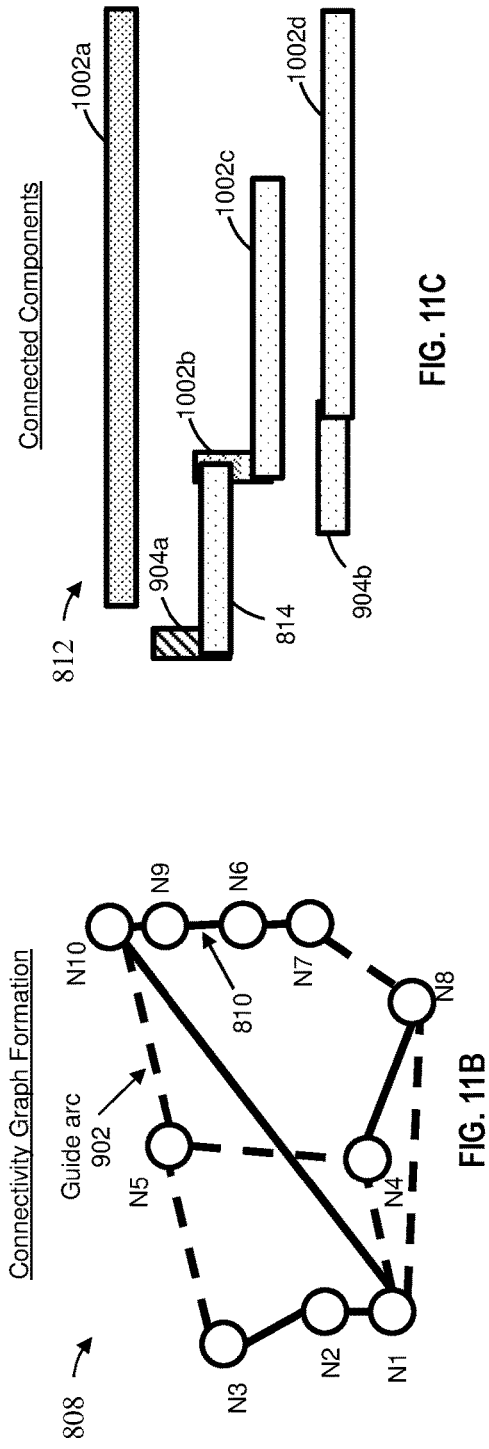
FIG. 11C
FIG. 11B

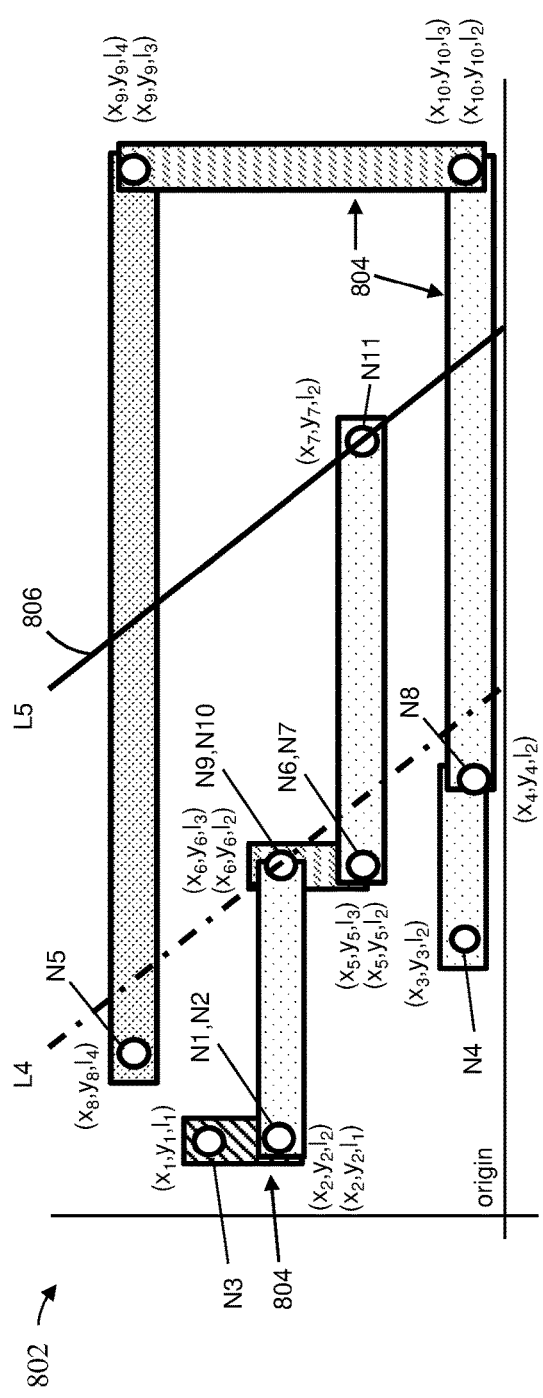
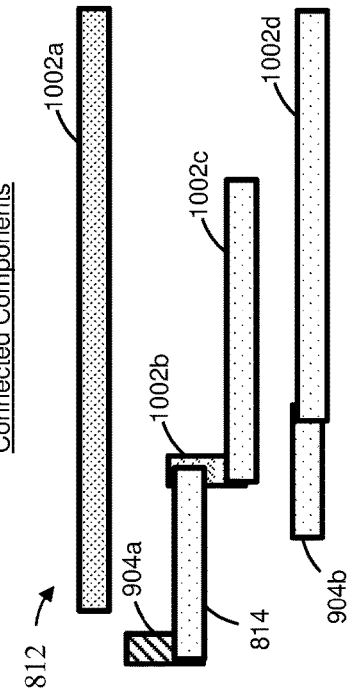
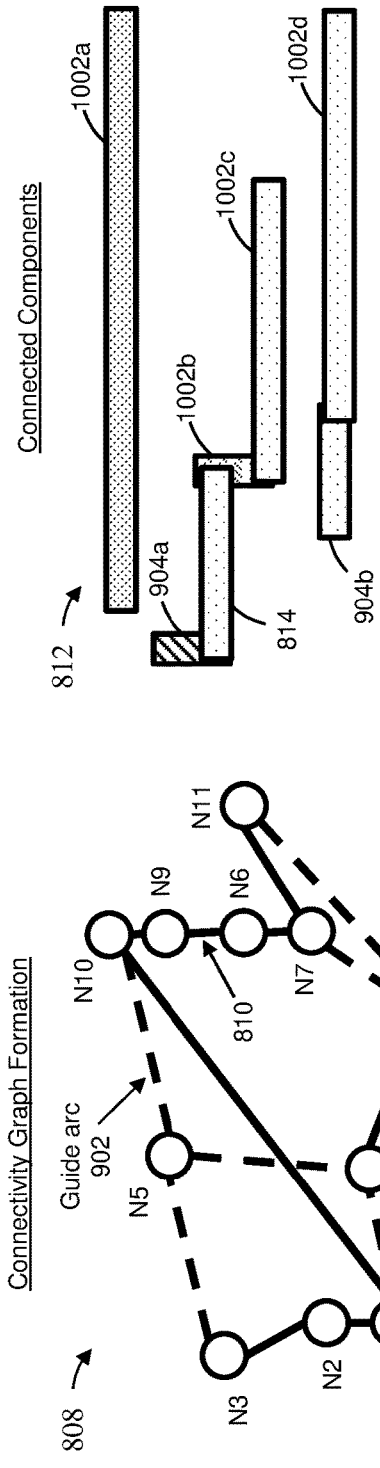
FIG. 12A
FIG. 12B
FIG. 12C

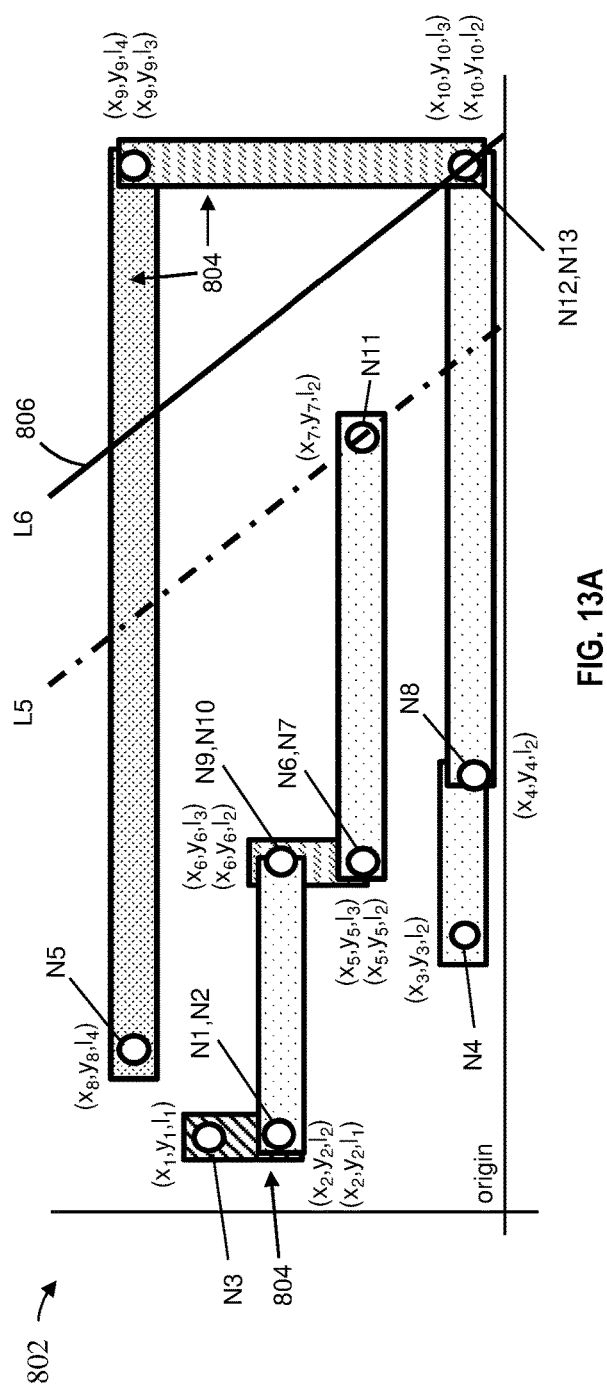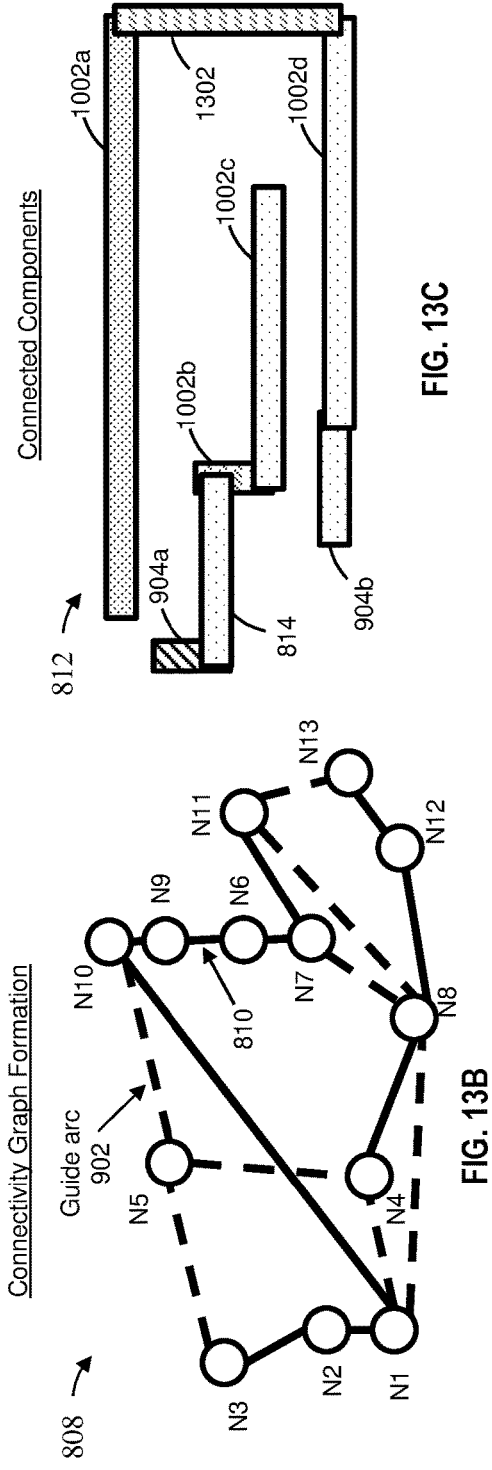
FIG. 13A
FIG. 13B
FIG. 13C

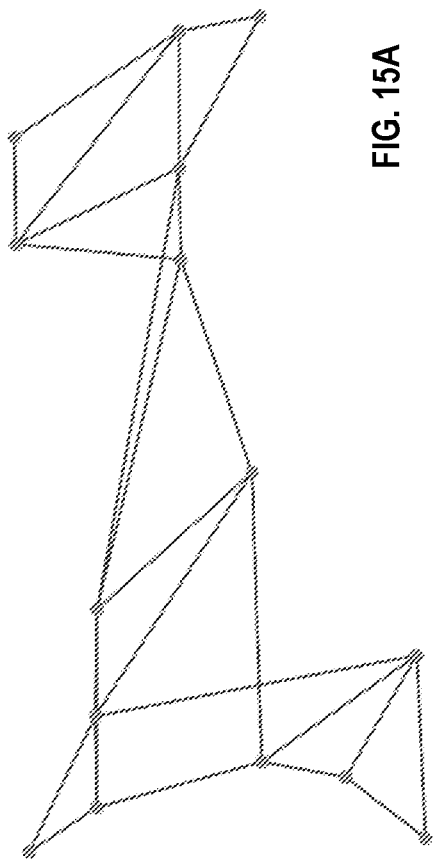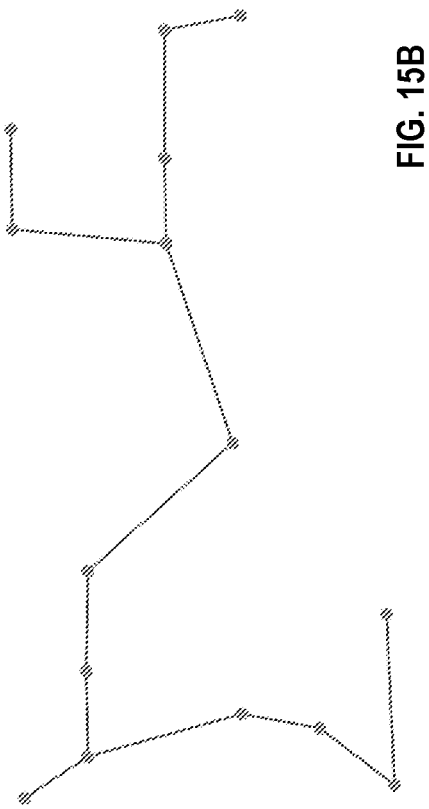

SWEEPLINE TRIANGULATION FOR SPANNING GRAPHS

BACKGROUND

The present invention generally relates to circuit design for integrated circuit structures. More specifically, the present invention relates to a sweepline triangulation technique to optimize spanning graphs for circuit routing.

Conventional integrated circuits are created by patterning a wafer or substrate to form various devices and interconnections. The process for designing an IC begins generally by hierarchically defining functional components of the circuit using a hardware description language. From this high-level functional description, a physical circuit implementation dataset known as a netlist is created. A netlist is a description of the connectivity of an electronic circuit. In its simplest form, a netlist identifies logic cell instances from a cell library and consists of a list of the electronic components in a circuit and a list of the nodes they are connected to (i.e., cell-to-cell connectivity information). A network (net) is a collection of two or more interconnected components.

A layout file is created using the netlist in a process known as placing and routing. The layout file assigns (i.e., places) logic cells to physical locations in the device layout and a software "router" or circuit designer routes their interconnections. In this manner, component devices and interconnections of the integrated circuit are constructed layer by layer. Once the layout file is generated, each layer is successively deposited onto the wafer and patterned using a photolithography process. These processes leverage one or more photomasks to transfer a layout pattern onto a physical layer on the wafer. Each photomask is created from the layout file of each wafer layer.

SUMMARY

Embodiments of the present invention are directed to methods for implementing a sweepline triangulation technique to optimize spanning graphs for circuit routing. A non-limiting example method includes receiving an unrouted net having a plurality of elements. The elements can include pins, vias, and wires. A sweepline is passed across the unrouted net until the sweepline intersects an element of the plurality of elements. In response to the sweepline intersecting the element, the sweepline is stopped and one or more nodes on the sweepline and one or more previous nodes are identified. A connectivity graph is built from the one or more nodes and the one or more previous nodes. The connectivity graph includes one or more arcs and one or more guides. A minimum spanning tree is built by removing one or more guides from the connectivity graph and the unrouted net is routed based on the minimum spanning tree.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 is a block diagram of a system configured to provide a circuit design that uses a sweepline triangulation technique to optimize spanning graphs for circuit routing in accordance with one or more embodiments of the present invention;

FIGS. 7A, 7B, and 7C illustrate pruning within the USWEET and LSWEET regions in accordance with one or more embodiments of the present invention;

FIGS. 8A, 8B, and 8C illustrate the modeling of a connectivity graph and connected components for a net in accordance with one or more embodiments of the present invention;

FIGS. 10A, 10B, and 10C illustrate the modeling of the connectivity graph and connected components for the net after a sweepline update in accordance with one or more embodiments of the present invention;

FIGS. 11A, 11B, and 11C illustrate the modeling of the connectivity graph and connected components for the net after a sweepline update in accordance with one or more embodiments of the present invention;

FIGS. 12A, 12B, and 12C illustrate the modeling of the connectivity graph and connected components for the net after a sweepline update in accordance with one or more embodiments of the present invention;

FIGS. 13A, 13B, and 13C illustrate the modeling of the connectivity graph and connected components for the net after a sweepline update in accordance with one or more embodiments of the present invention;

FIG. 15A illustrates an example connectivity graph formed in accordance with one or more embodiments of the present invention;

FIG. 15B illustrates an example minimum spanning tree formed from the connectivity graph of FIG. 15A in accordance with one or more embodiments of the present invention;

DETAILED DESCRIPTION

Figure 1:
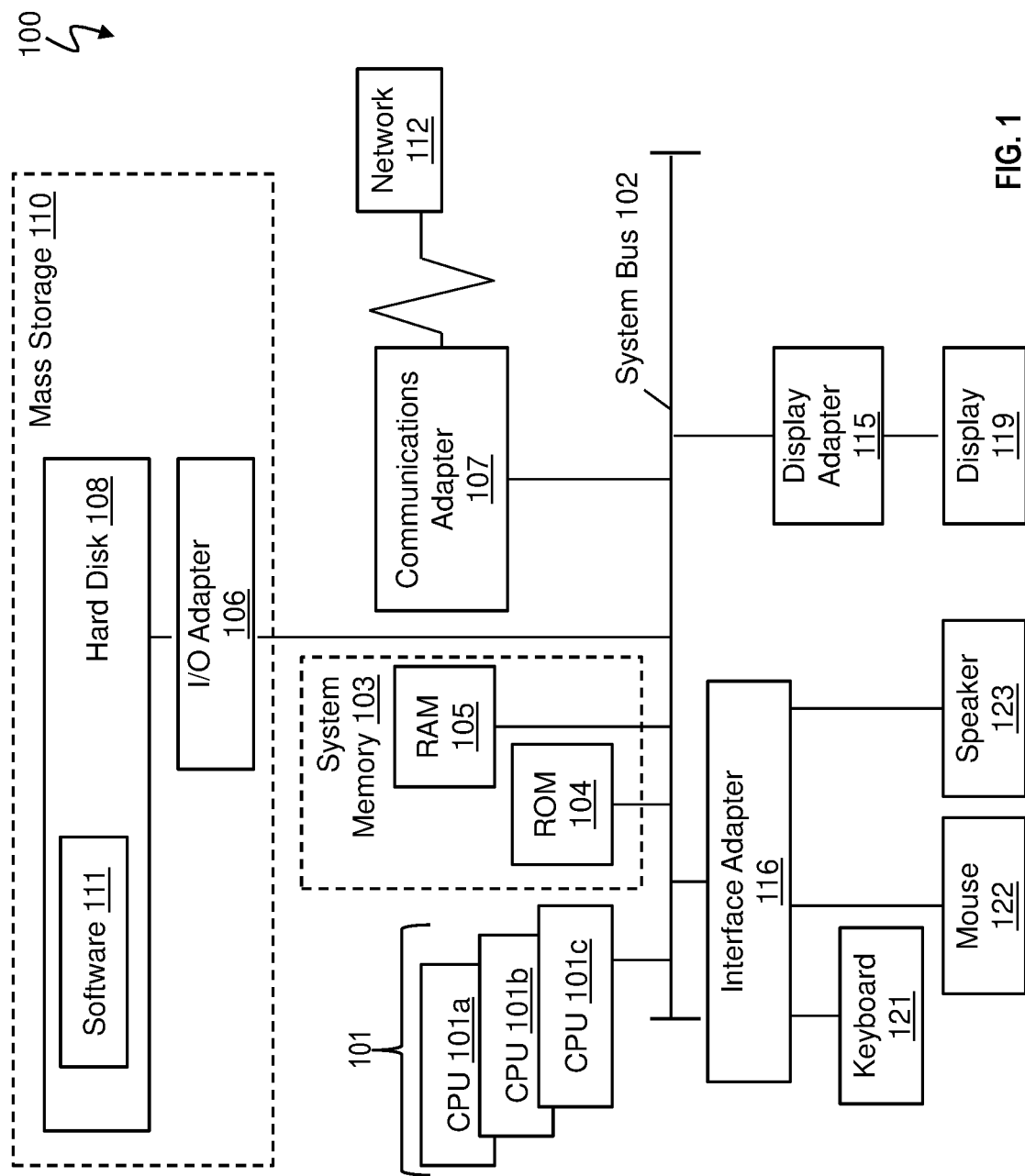
FIG. 1 depicts a block diagram of an example computer system for use in conjunction with one or more embodiments of the present invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, wire routing, or simply routing, is a step in the design of printed circuit boards (PCBs) and integrated circuits (ICs). Routing follows the placement step, which determines the location of each active element of an IC or component on a PCB. Routing includes adding and positioning the various wires needed to properly connect the placed components while obeying all design rules (e.g., timing, crosstalk, and metal density requirements).

Generally, the task of all routers is the same. Given some pre-existing polygons consisting of terminals (also referred to as pins) on cells, e.g., the elements defined during the placement step, create geometries such that all terminals assigned to the same net are connected, no terminals assigned to different nets are connected, and all design rules are obeyed.

Unfortunately, almost every routing problem is known to be intractable. In computational complexity theory, an "intractable" problem is one that can be solved in theory (e.g., given large but finite resources, especially time), but for which in practice any solution takes too many resources to be useful. For example, the simplest routing problem of finding the shortest route for one net in one layer with no obstacles and no design rules is NP-hard if all angles are allowed and NP-complete if only horizontal and vertical wires are allowed (the so-called Steiner tree problem). Variants of channel routing have also been shown to be NP-complete, as well as routing solutions which reduces crosstalk, number of vias, and so on. Routers therefore seldom attempt to find the most optimal result, instead, almost all routing relies upon heuristics which try to find a solution that is "good enough" within the context of the respective application (i.e., a solution that satisfies all routing and design rule requirements).

One approach to routing is to place wires that satisfy a minimum spanning tree for the components defined during placement. In Euclidean space, a minimum spanning tree is referred to as a Euclidean minimum spanning tree (EMST). An EMST is a minimum spanning tree of a set of n points in the plane or higher-dimensional Euclidean space. The EMST connects the points by a system of line segments, so that any two points can reach each other along a path through the line segments, and it selects line segments that minimize the sum of the Euclidean distances between directly-connected pairs of points. In the plane (i.e., dimension d=2), the EMST is a subgraph of the Delaunay triangulation. Using this fact, a minimum spanning tree can be optimally solved with O(n log n) complexity for 2D space. For dimension>3 this is still an open problem. Routing complexity in 3D space can be exponential and can even go quadratic depending upon the problem type.

One or more embodiments of the present invention address one or more of the above-described shortcomings by providing a sweepline triangulation technique to optimize spanning graphs for circuit routing. Embodiments of the present invention provide a mechanism to compute a minimum spanning tree for a set of metal shapes in a 3D circuit design (e.g., VLSI design) in close to O(n log n) time.

In some embodiments of the invention, computational geometry is leveraged to prune out nodes from a spanning graph, which reduces the size of the spanning graph for multi-dimensional shapes, thus enabling a fast-spanning tree creation. This approach is referred to throughout as sweepline triangulation (SWEET). SWEET can be broken down into the following segments: creation of upper SWEET and lower SWEET regions in a sweepline to define a region of influence; tagging metal shapes and removing them from the sweepline once they have no influence; and optimizing metal shape selection in all regions of influence to create the spanning graph.

Advantageously, leveraging SWEET according to one or more embodiments to optimize spanning graphs for circuit routing offers several technical solutions over conventional routing schemes. As an initial matter, SWEET-based routing can approach O(n log n) time for 3D circuit designs, which approaches the optimal time complexity for 2D space. This is vastly faster than the exponential or quadratic time complexity typically required for 3D routing. While SWEET is discussed in the context of a net in the circuit design space, the concepts employed can easily be generalized to any multi-dimensional computational geometry problem. For example, creating fast and pruned spanning graphs in multi-dimensional space according to one or more embodiments has a wide range of applications, from fast and efficient electronic design automation (EDA) to gaming and image processing applications where computation geometry is heavily used. Spanning trees are also heavily used in various network designs (roads, telephone/power line distribution, etc.), cancer imaging, and clustering analysis.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node (e.g., a node 10 of FIG. 17 below). Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

FIG. 2 is a block diagram of a system 200 configured to provide a circuit design that uses a sweepline triangulation technique to optimize spanning graphs for circuit routing according to embodiments of the invention. The system 200 includes processing circuitry 210 used to generate the design that is ultimately fabricated into an integrated circuit 220. The steps involved in the fabrication of the integrated circuit 220 are well-known and briefly described herein. Once the physical layout is finalized, based, in part, on a sweepline triangulation methodology that optimizes circuit routing, to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 3.

Figure 3:
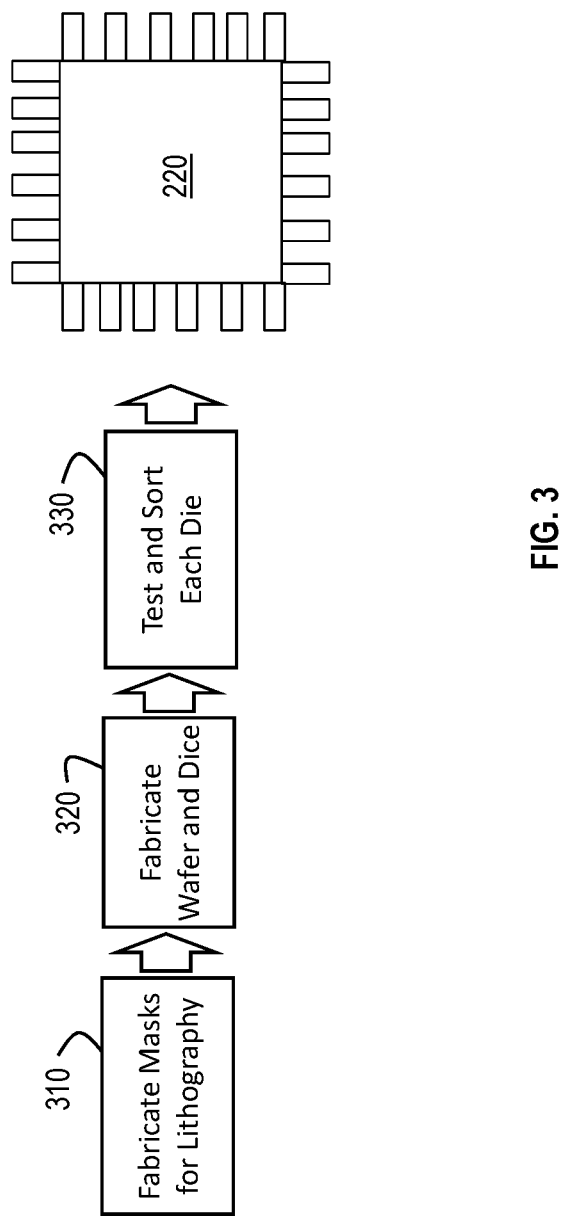
FIG. 3 is a process flow of a method of fabricating an integrated circuit in accordance with one or more embodiments of the present invention.

FIG. 3 is a process flow of a method of fabricating an integrated circuit (e.g., the IC 220 of FIG. 2) according to exemplary embodiments of the invention. Once the physical design data is obtained, based, in part, on a sweepline triangulation methodology that optimizes circuit routing, the integrated circuit 220 can be fabricated according to known processes that are generally described with reference to FIG. 3. Generally, a wafer with multiple copies of the final design is fabricated and cut (i.e., diced) such that each die is one copy of the integrated circuit 220. At block 310, the processes include fabricating masks for lithography based on the finalized physical layout. At block 320, fabricating the wafer includes using the masks to perform photolithography and etching. Once the wafer is diced, testing and sorting of each die is performed, at block 330, to filter out any faulty die.

Figure 4B:
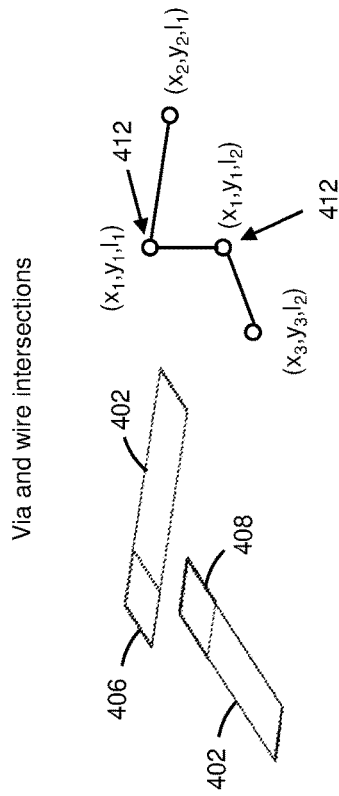
FIGS. 4A, 4B, and 4C illustrate the modeling of a net using a connectivity graph in accordance with one or more embodiments of the present invention.
Figure 4A:
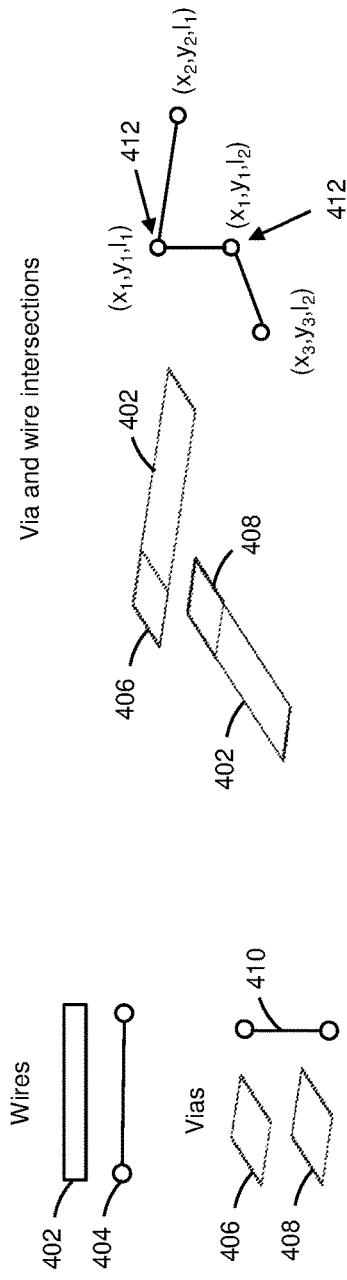
Figure 4C:
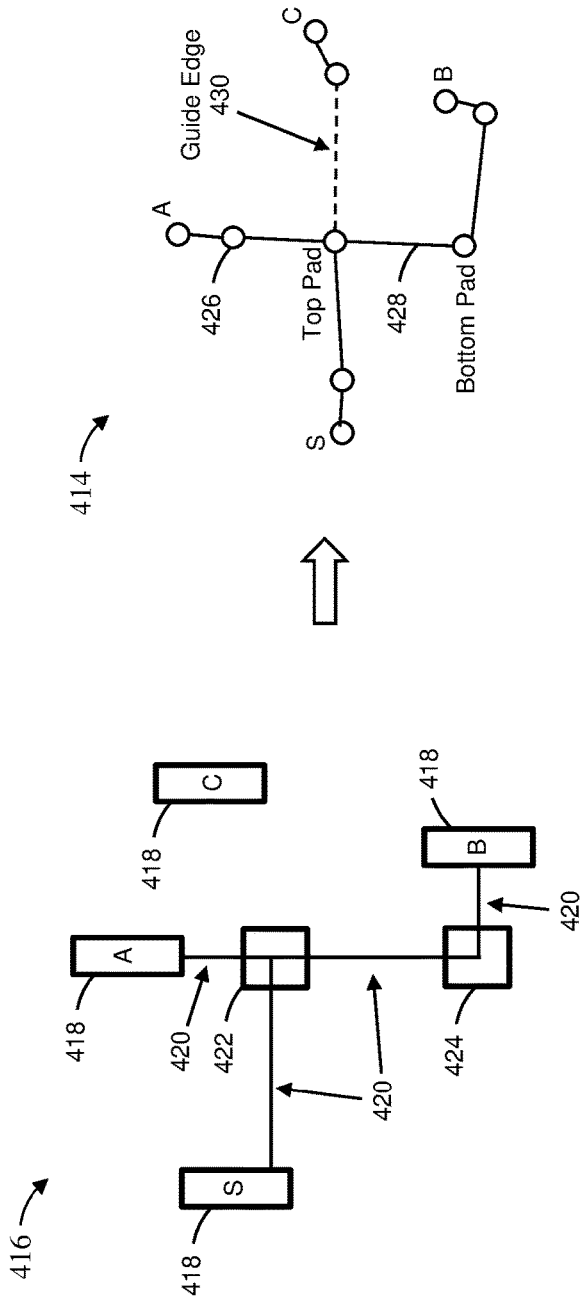

FIGS. 4A, 4B, and 4C illustrate the modeling of a net using a connectivity graph according to one or more embodiments. As used herein, a connectivity graph (or a stick connectivity graph) G(V,E) is defined as a set of vertices (V) connected by a set of edges (E). A vertex (or node) is a coordinate defined by: $[x_n, y_n, l_n]$, where x and y are the respective coordinates in a layer l of a net. Vertices represent the various pin centers, intersection points between wires and pins, stick and guide end points, and via mesh top layer and wire intersections in the net. Edges are sticks (arcs) which couple two vertices and can be defined by: $[x_n, y_n, l_n], [x_m, y_m, l_m]$. Edges represent the various wires, vias, guides, and wire-pin intersections in the net.

As shown in FIG. 4A, in some embodiments of the invention, wire segments 402 can be represented by two nodes and an arc (collectively, element 404) in a connectivity graph. Similarly, a via, split between a top pad 406 and a bottom pad 408, can be represented by two nodes and an arc (collectively, element 410).

FIG. 4B depicts via and wire intersections between a via having a top pad 406 located at $(x_1, y_1, l_1)$ and a bottom pad 408 located at $(x_1, y_1, l_2)$ in the net, and wire segments 402 located at $(x_3, y_3, l_2), (x_1, y_1, l_2)$ and $(x_1, y_1, l_1), (x_2, y_2, l_1)$ in the net. Via and wire intersections necessarily result in two nodes in the same position (one node from the wire and one node from the respective via, e.g., at the location $(x_1, y_1, l_1)$). In some embodiments of the invention, only one node is created at the via-wire intersection locations 412.

FIG. 4C illustrates an example connectivity graph 414 for a net 416 formed according to the conventions explored in FIGS. 4A and 4B. As shown in FIG. 4C, the net 416 includes various pins 418 (here, pins "S", "A", "B", and "C"), wires 420, and a via having a top pad 422 and a bottom pad 424. These components are translated into a set of nodes 426 and arcs 428. FIG. 4C depicts another concept, that of a guide edge 430, which is placed between pin "C" and the top pad 422. The guide edge 430 represents an open and serves to couple the pin "C", which is otherwise isolated, to the other structural elements of the net 416. The creation of guides (guide edges, opens) ensures that a path with minimum distance (e.g., a MST) can be created that traverses each pin only once. The placement of guide edges (or guide arcs) is discussed is further detail below.

Figure 5:
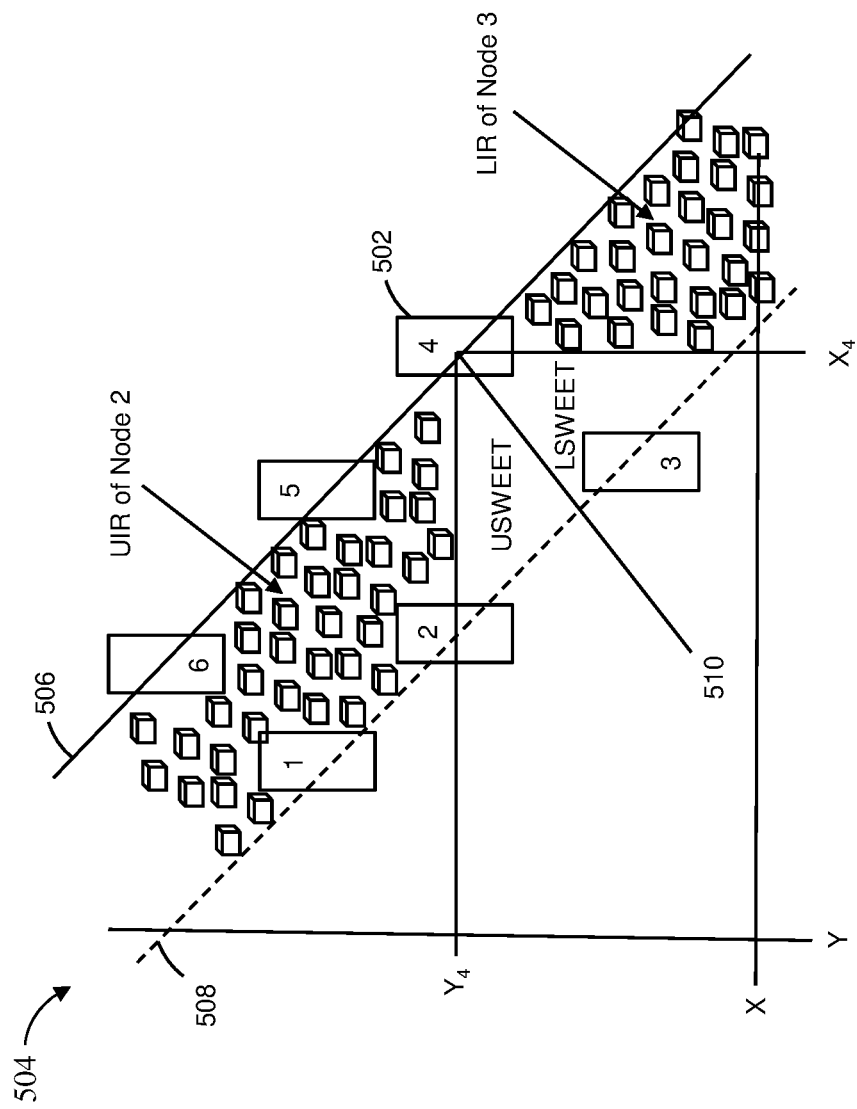
FIG. 5 illustrates the concept of pruning nodes from a minimum spanning tree using sweeplines in accordance with one or more embodiments of the present invention.

FIG. 5 illustrates the concept of pruning nodes from a minimum spanning tree using sweeplines in accordance with one or more embodiments of the present invention. As shown in FIG. 5, a set of nodes 502 (here, nodes "1", "2", "3", "4", "5", and "6") are arranged over a coordinate system 504. Each of the nodes 502 can represent an element of a net, such as, for example, a stick end point, a pin center, etc., in multi-dimensional space with coordinates $(x_n, y_n, l_n)$. Note that for simplicity the layer dimension $l_n$ is not shown—instead, sweepline interactions across multiple layers are shown below with respect to FIGS. 8A-14C.

We define a sweepline as line having a fixed slope and a sweepline event as an intersection at point $(x_n, y_n)$ between a sweepline and an element in a net (see FIGS. 4A, 4B, and 4C for a discussion of nets and connectivity graphs). Sweepline events can include, for example, intersections with pins (pin events), via stick begin events, via stick end events, wire stick begin events, wire stick end events, etc. In some embodiments of the invention, a sweepline is run from left to right across the connectivity graph, although this is by convention only. The slope chosen for the sweepline is not meant to be particularly limited. In some embodiments of the invention, the sweepline is a 45-degree angle having a slope of −1. Other slopes are possible and within the contemplated scope of the disclosure.

In some embodiments of the invention, a connectivity graph can be created by passing a sweepline across the elements in a net. In some embodiments of the invention, two or more sweepline events can occur at the same time (e.g., multiple nodes can be positioned at the same x,y coordinates). In some embodiments of the invention, resultant sweepline events can be filtered in a predefined order. For example, events can be filtered in the order of: layer, pin event, end wire stick event, begin wire stick event, begin via stick event, and end via stick event, although other filtering/priority schemes are possible. In some embodiments of the invention, events having the same (x,y) location, albeit at different layers, are sorted from the bottommost layer to the topmost layer and all such events are covered in the same sweepline, although this choice in direction is by convention only.

In some embodiments of the invention, a node in the graph is created for each of the current sweepline events. In some embodiments of the invention, for every end stick event (wire and via) an arc is created to its corresponding begin stick event. In some embodiments of the invention, a connected component is created at each sweepline event. In some embodiments of the invention, connected components are merged when they intersect. Connected components are discussed below with respect to FIGS. 8A-14C. Once all nodes and connected components are placed, the sweepline is moved to the next location. In this manner the sweepline is progressively moved through the net until all nodes and arcs are placed. The placed nodes and arcs define a connectivity graph for the net.

Once the connectivity graph nodes and edges are complete (step 1), a minimum spanning tree (MST) can be built according to the following flow: Track connectivity graph connected components up to the current sweepline position (step 2); create guides and maintain a partially computed MST between the connected components in step 2 (step 3); and at the end of the sweepline traversal compute the MST on the list of guide candidates (step 4).

In some embodiments of the invention, nodes are pruned from the MST. As shown in FIG. 5, a sweepline is moved (swept) from left to right across the nodes 502. We define the current location of the sweepline as the current sweepline 506. We define the previous location of the sweepline (immediately previous) as the previous sweepline 508. At the current sweepline 506, for a given node (e.g., node 4), we define "previous nodes" (none in this case) and "next nodes" (e.g., nodes 5, 6) as the preceding and following nodes, respectively, along the arc of the sweepline. For the given node at the current position 506 of the sweepline, two orthogonal lines are drawn to the x-axis (here, $X_4$) and y-axis (here, $Y_4$). Observe that these lines will intersect the previous sweepline 508 at most two locations and a triangle is thereby created. A 45-degree angle line 510 is drawn from the current node (here, node "4") and it divides the triangle into two parts: we define the upper region as the upper sweepline triangle ("USWEET") and the lower region as the lower sweepline triangle ("LSWEET").

From geometry it can be derived that, for a given node at the current sweepline 506 (e.g., node 4), an arc created from any node falling in the previous sweepline 508 under USWEET (e.g., node 2) to any previous node at the current sweepline 506 (i.e., any node having an X position>$X_4$; no nodes in the current example) will always be longer as compared to an arc from node 4. Consequently, we observe that there is no need to create an arc from node 2 to any previous node with respect to node 4. Similarly, an arc created from any node falling in the previous sweepline 508 under LSWEET (e.g., node 3), to any next node at the current sweepline 506 (i.e., any node having a Y position>$Y_4$; here, nodes 5 and 6) will always be longer as compared to an arc from node 4. We similarly conclude that there is no need to create an arc from node 3 to any next node with respect to node 4.

These geometrical relationships can be leveraged to define two additional areas: an upper impact region (UIR) and a lower impact region (LIR). The UIR and LIR are defined relative to nodes from the previous sweepline 508. In particular, the UIR denotes the area above USWEET that a node falling in the previous sweepline 508 within USWEET (e.g., node 2) can impact. In other words, the UIR defines the region in which the respective node (e.g., node 2) may be able to offer a shorter arc than the current node (continuing with the previous example, node 4). We observe that a node falling in the previous sweepline 508 within USWEET (e.g., node 2) will impact the next nodes in the current sweepline 506 (e.g., nodes 5, 6). This observation is proved by induction below with respect to FIG. 6.

Similarly, the LIR denotes the area to the right of LSWEET that a node falling in the previous sweepline 508 within LSWEET (e.g., node 3) can impact. In other words, the LIR defines the region in which the respective node (e.g., node 3) may be able to offer a shorter arc than the current node (continuing with the previous example, node 4). We observe that a node falling in the previous sweepline 508 within USWEET (e.g., node 3) will impact the previous nodes in the current sweepline 506 (no nodes from perspective of node 4). This observation is also proved by induction below with respect to FIG. 6.

Combining the previous geometrical relationships, observe that, for a given node in the current sweepline 506, only four nodes need to be checked to construct a minimum spanning tree, one node from each of the four regions USWEET, LSWEET, UIR, and LIR. In some embodiments of the invention, each node under the previous sweepline 508 is marked with either or both of USWEET and LSWEET based on its relative position to those regions. In some embodiments of the invention, once a node has been marked (or labeled) with each of USWEET and LSWEET (e.g., each of a USWEET and LSWEET field is set to true), the node is expelled from the sweepline process. Advantageously, within the USWEET and LSWEET regions arcs can be pruned using known processes, such as, for example, Delaunay triangulation. FIGS. 7A-7C illustrate this process in detail.

Figure 6:
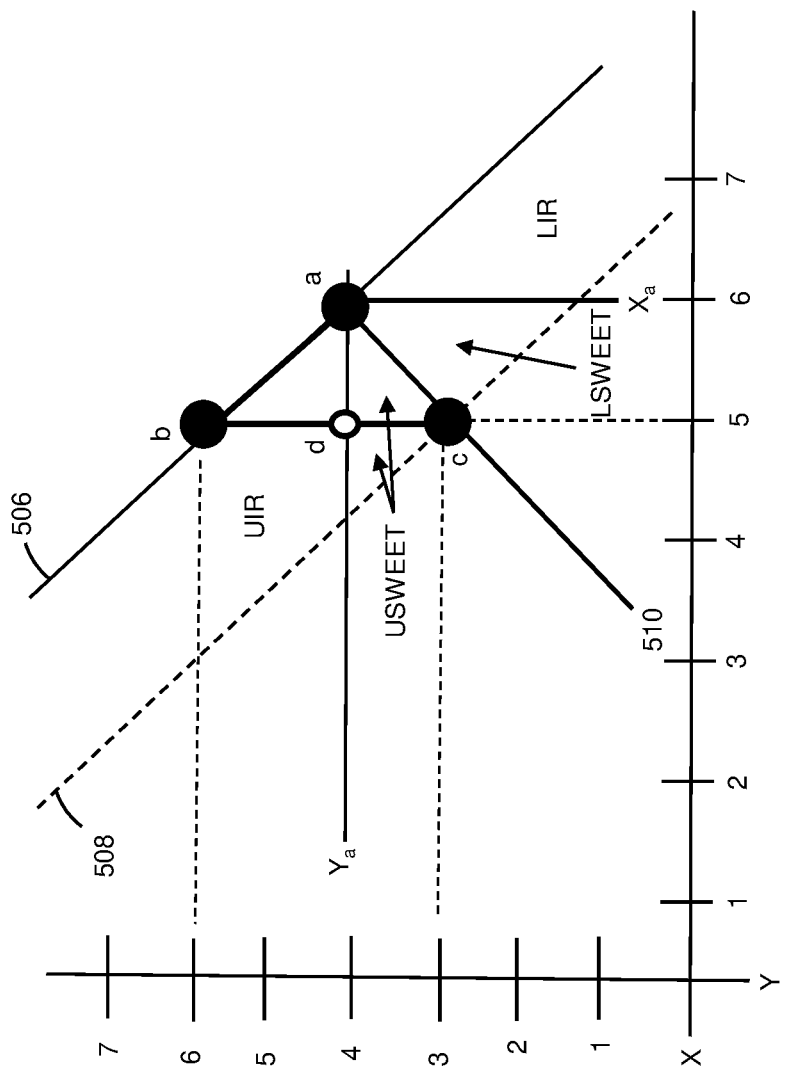
FIG. 6 illustrates a proof of the upper impact region (UIR) and the lower impact region (LIR) defined in accordance with one or more embodiments of the present invention.

FIG. 6 illustrates a proof of the UIR and LIR concepts defined previously in accordance with one or more embodiments of the present invention. As shown in FIG. 6, suppose there are a set of nodes in the current sweepline 506 (here, the 2 nodes "a" and "b") and a set of nodes in the previous sweepline 508 (here, node "c"). Suppose further that the current node in action is node "a" (that is, node "a" is the node against which the other nodes will be compared with respect to the regions USWEET, LSWEET, UIR, and LIR).

A triangle can be drawn using node a, horizontal line $Y_a$, vertical line $X_a$, and the previous sweepline 508, as discussed previously. USWEET and LSWEET regions can be defined by splitting said triangle into 2 parts using a 45-degree angle line 510, as discussed previously. To show that any point in LSWEET has no influence on a point falling within the UIR region, a line is drawn from node c to node b. This line intersects one side of the triangle, at point d. Observe that the result is an isosceles triangle with sides: dc, da, ac. Therefore, dc+db==da+db. Note however, that for node c to influence any point within the UIR: dc must be <=da (else node a would provide a shorter arc). Therefore, we can conclude that for any point under LSWEET, dc>da.

If dc>da, in that case point c will lie in the lower triangle region (LSWEET) and will have no effect on point b which is in UIR region.

FIGS. 7A, 7B, and 7C illustrates pruning within the USWEET and LSWEET regions in accordance with one or more embodiments of the present invention. As shown in FIG. 7A, a set of nodes 702 (representing, e.g., metal shapes, lines, vias, etc.) have been positioned per a placement step. A sweepline 704 is moved until a sweepline event is triggered (here, intersection with node "a" of the nodes 702). As further shown in FIG. 7A, horizontal line $Y_a$, vertical line $X_a$, and 45-degree line 706 are drawn from node "a" to define a triangle and regions USWEET and LSWEET, as discussed previously. In some embodiments of the invention, each node in the USWEET region is tagged with a USWEET indicator. Similarly, each node in the LSWEET region is tagged with a LSWEET indicator. Continuing with the previous example, node b is tagged "USWEET" and node c is tagged "LSWEET".

In FIG. 7B the position of the sweepline 704 has been updated. In some embodiments of the invention, the sweepline 704 is moved until the next sweepline event is triggered (here, intersection with nodes "d" and "e"). Horizontal, vertical, and 45-degree angle lines $Y_e$, $Y_d$, $X_d$, $X_e$, and 706 are drawn from nodes "d" and "e" in a similar manner as done previously with respect to node "a". Continuing with the previous example, node "b", which is now in the LSWEET region of node "e", is tagged with an "LSWEET" indicator. Note that while node "b" also lies within the USWEET region of node "d", node "b" has already been tagged "USWEET" (from FIG. 7A) and duplicates are not needed. Node "c" in the USWEET region of node "d" and is tagged accordingly.

In FIG. 7C the position of the sweepline 704 has been updated again. In some embodiments of the invention, the sweepline 704 is moved until the next sweepline event is triggered (here, intersection with node "f"). Horizontal, vertical, and 45-degree angle lines $Y_f$, $X_f$, and 706 are drawn from node "f" in a similar manner as done previously with respect to node "a". In some embodiments of the invention, nodes "b" and "c", each now having both USWEET and LSWEET indicators, are pruned (removed). Continuing with the previous example, nodes "a" and "e" are tagged USWEET and node "d" is tagged LSWEET. While the pruning operation depicted in FIGS. 7A, 7B, and 7C appears to end at FIG. 7C for ease of illustration, it should be understood that pruning can be repeated indefinitely until all nodes have triggered a sweepline event. That is, the position of the sweepline 704 can be updated, new nodes can be triggered, tagged, and ultimately, removed (once having both USWEET and LSWEET indicators).

FIGS. 8A, 8B, and 8C illustrate the modeling of a connectivity graph and connected components for a net in accordance with one or more embodiments of the present invention. As shown in FIG. 8A, a net 802 includes a plurality of components 804, such as, for example, the via (top and bottom metal pads) and wire stick at locations ($x_2$, $y_2$, $l_1$) and ($x_2$, $y_2$, $l_2$). The net 802 is provided as an example for ease of discussion only. Other net configurations are possible, and all such configurations are within the contemplated scope of the disclosure. In some embodiments of the invention, the net 802 is an unrouted net. As further shown in FIG. 8A, a sweepline 806 having an initial position "L1" is run over the net 802.

FIG. 8B depicts a (partial) connectivity graph 808 for the net 802 formed in accordance with one or more embodiments of the present invention. To begin building the connectivity graph 808, the sweepline 806 is run over the net 802 until a sweepline event is triggered at and sweepline events are executed, as discussed previously. In the present example, a sweepline event is trigger at location "L1" and two nodes N1 and N2 are created to represent the via pads and wire stick at locations $(x_2, y_2, l_1)$ and $(x_2, y_2, l_2)$. An arc 810 is created between N1 and N2 (continuing with the present example, this arc represents the connection between the top and bottom via pads).

FIG. 8C depicts a (partial) set of connected components 812 for the net 802 in accordance with one or more embodiments of the present invention. To begin building the connected components 812, the component 814 (e.g., a metal shape) of the components 804 at the $(x_2, y_2)$ position (across both layers $l_1$ and $l_2$) corresponding to the current position L1 of the sweepline 806 is added to the set of connected components 812.

Figure 9A:
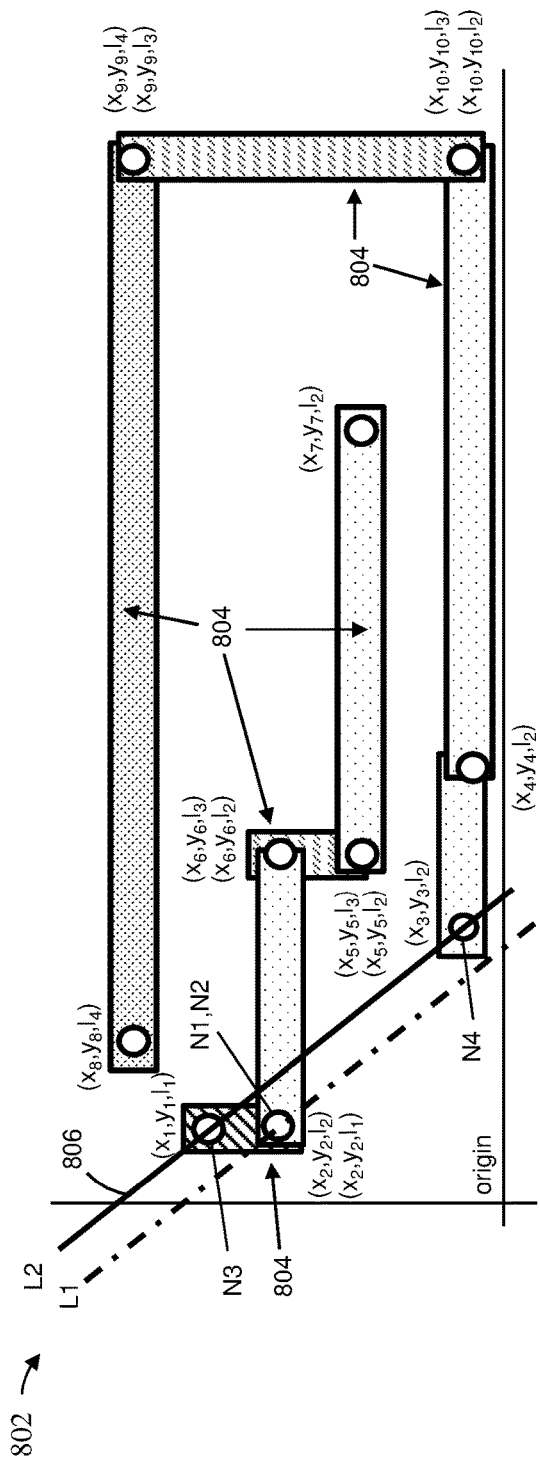
FIGS. 9A, 9B, and 9C illustrate the modeling of the connectivity graph and connected components for the net after a sweepline update in accordance with one or more embodiments of the present invention.
Figure 9C:
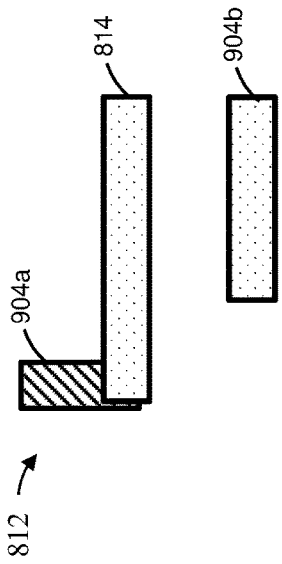
Figure 9B:
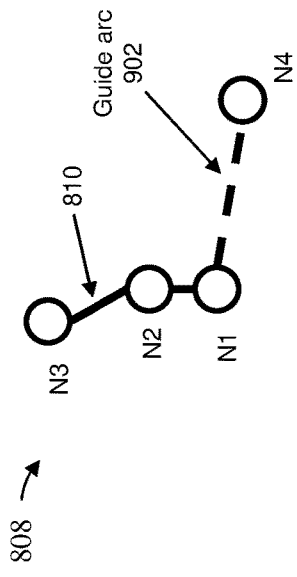

FIGS. 9A, 9B, and 9C illustrate the connectivity graph 808 and connected components 812 for the net 802 after updating the sweepline 806 in accordance with one or more embodiments of the present invention. As shown in FIG. 8A, the sweepline 806 moves to new location "L2." The previous position L1 is now denoted by a dashed line.

FIG. 9B depicts the connectivity graph 808 after new nodes are created due to the sweepline events at the position L2. Continuing from the previous example, new nodes N3 and N4 are created for locations $(x_1, y_1, l_1)$ and $(x_3, y_3, l_2)$, respectively. Here, the nodes N3 and N4 each denote a pin center at their respective locations in the net 802. An arc 810 is created between N2 and N3 (this arc represents the pin and stick intersection at $x_1, y_1$).

As further shown in FIG. 9B, a guide arc 902 is placed between nodes N1 and N4 according to the triangulation approach discussed previously. In some embodiments of the invention, guide arcs (guides) can be placed according to a list of predefined placement conditions. In some embodiments of the invention, guides are not created between nodes which lie on the same connected component. In some embodiments of the invention, guides are not created from via stick nodes. In some embodiments of the invention, only one node is selected to create guides from a two wire intersection points. For example, observe that either of nodes N1 and N2 could serve as the anchor for the guide arc 902. To limit the number of guides constructed, only one of N1 and N2 is selected to create a guide.

FIG. 9C depicts the connected components 812 after new components 904a, 904b are added due to the sweepline events at the position L2. Components 904a, 904b correspond to the components 804 in the net 802 (here, metal shapes at the $(x_1, y_1)$ and $(x_3, y_3)$ locations, respectively).

FIGS. 10A, 10B, and 10C illustrate the connectivity graph 808 and connected components 812 for the net 802 after updating the sweepline 806 in accordance with one or more embodiments of the present invention. As shown in FIG. 10A, the sweepline 806 moves to new location "L3." The previous position L2 is now denoted by a dashed line.

FIG. 10B depicts the connectivity graph 808 after new nodes are created due to the sweepline events at the position L3. Continuing from the previous example, new nodes N5, N6, N7, and N8 are created for locations $(x_8, y_8, l_4)$, $(x_5, y_5, l_3)$, $(x_5, y_5, l_2)$, and $(x_4, y_4, l_2)$, respectively. Here, the nodes N5 and N8 each denote a pin center at their respective locations in the net 802. Nodes N6 and N7 denote top and bottom via pads, respectively. A plurality of arcs 810 and guide arcs 902 are created between the nodes in a similar manner as discussed previously with respect to FIGS. 8B and 9B. After creating the guide arcs 902, nodes N1, N2, and N4 leave the sweepline. The nodes can be removed (pruned) as explained previously with respect to FIGS. 7A, 7B, and 7C. For example, USWEET and LSWEET regions can be defined for each node in the sweepline (not shown for ease of illustration) and nodes can be purged once tagged with both USWEET and LSWEET indicators.

FIG. 10C depicts the connected components 812 after new components 1002a, 1002b, 1002c, and 1002d are added due to the sweepline events at the position L3. Components 1002a, 1002b, 1002c, and 1002d correspond to the components 804 in the net 802 (here, metal shapes and vias at the $(x_8, y_8)$, $(x_5, y_5)$, and $(x_4, y_4)$ locations).

FIGS. 11A, 11B, and 11C illustrate the connectivity graph 808 and connected components 812 for the net 802 after updating the sweepline 806 in accordance with one or more embodiments of the present invention. As shown in FIG. 11A, the sweepline 806 moves to new location "L4." The previous position L3 is now denoted by a dashed line.

FIG. 11B depicts the connectivity graph 808 after new nodes are created due to the sweepline events at the position L4. Continuing from the previous example, new nodes N9 and N10 are created for locations $(x_6, y_6, l_3)$ and $(x_6, y_6, l_2)$, respectively. Here, the nodes N9 and N10 each denote top and bottom via pads, respectively. A plurality of arcs 810 and guide arcs 902 are created between the nodes in a similar manner as discussed previously with respect to FIGS. 8B and 9B.

FIG. 11C depicts the connected components 812 after the sweepline events at the position L4. As shown in FIG. 11C, no new components are added.

FIGS. 12A, 12B, and 12C illustrate the connectivity graph 808 and connected components 812 for the net 802 after updating the sweepline 806 in accordance with one or more embodiments of the present invention. As shown in FIG. 12A, the sweepline 806 moves to new location "L5." The previous position L4 is now denoted by a dashed line.

FIG. 12B depicts the connectivity graph 808 after new nodes are created due to the sweepline events at the position L5. Continuing from the previous example, new node N11 is created for location $(x_7, y_7, l_2)$. Here, the node N11 denotes a pin center at location $(x_7, y_7)$ in the net 802. A plurality of arcs 810 and guide arcs 902 are created between the nodes in a similar manner as discussed previously with respect to FIGS. 8B and 9B. After creating the guide arcs 902, nodes N6 and N7 leave the sweepline. The nodes can be removed (pruned) as explained previously with respect to FIGS. 7A, 7B, and 7C.

FIG. 12C depicts the connected components 812 after the sweepline events at the position L5. As shown in FIG. 12C, no new components are added.

FIGS. 13A, 13B, and 13C illustrate the connectivity graph 808 and connected components 812 for the net 802 after updating the sweepline 806 in accordance with one or more embodiments of the present invention. As shown in FIG. 13A, the sweepline 806 moves to new location "L6." The previous position L5 is now denoted by a dashed line.

FIG. 13B depicts the connectivity graph 808 after new nodes are created due to the sweepline events at the position L6. Continuing from the previous example, new nodes N12 and N13 are created for locations $(x_{10}, y_{10}, l_3)$ and $(x_{10}, y_{10}, l_2)$, respectively. Here, the nodes N12 and N13 each denote top and bottom via pads, respectively. A plurality of arcs 810 and guide arcs 902 are created between the nodes in a similar manner as discussed previously with respect to FIGS. 8B and 9B. After creating the guide arcs 902, node N8 leaves the sweepline. The node can be removed (pruned) as explained previously with respect to FIGS. 7A, 7B, and 7C.

FIG. 13C depicts the connected components 812 after new component 1302 is added due to the sweepline events at the position L6. Component 1302 corresponds to the metal shape (of the components 804) in the net 802 at $(x_{10}, y_{10})$.

Figure 14A:
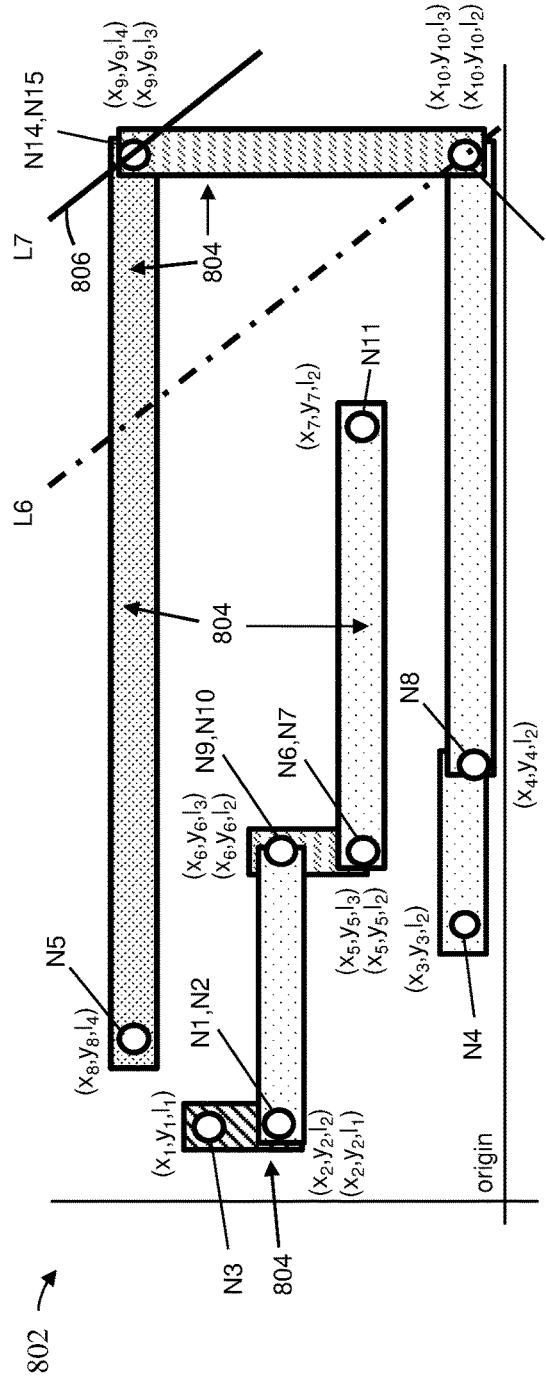
FIGS. 14A, 14B, and 14C illustrate the modeling of the connectivity graph and connected components for the net after a sweepline update in accordance with one or more embodiments of the present invention.
Figure 14C:
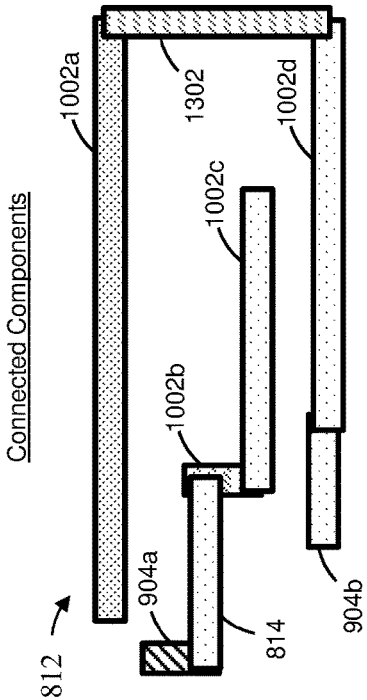
Figure 14B:
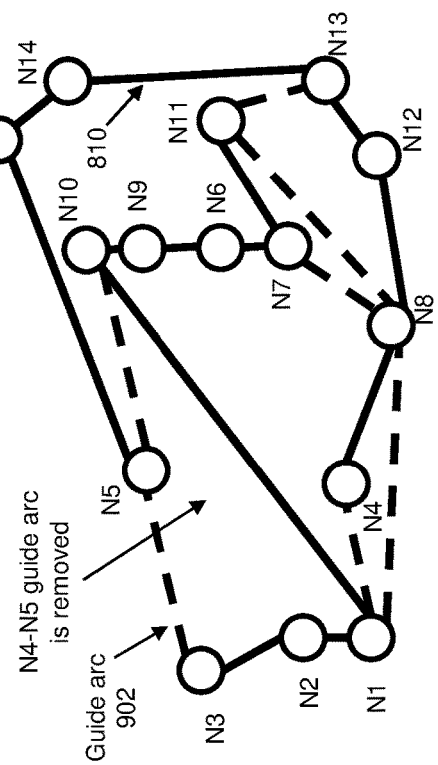

FIGS. 14A, 14B, and 14C illustrate the connectivity graph 808 and connected components 812 for the net 802 after updating the sweepline 806 in accordance with one or more embodiments of the present invention. As shown in FIG. 14A, the sweepline 806 moves to new location "L7." The previous position L6 is now denoted by a dashed line.

FIG. 14B depicts the connectivity graph 808 after new nodes are created due to the sweepline events at the position L7. Continuing from the previous example, new nodes N14 and N15 are created for locations $(x_9, y_9, l_4)$ and $(x_9, y_9, l_3)$, respectively. Here, the nodes N14 and N15 each denote top and bottom via pads, respectively. A plurality of arcs 810 and guide arcs 902 (here, no new guide arcs are needed) are created between the nodes in a similar manner as discussed previously with respect to FIGS. 8B and 9B. After creating the guide arcs 902, node N3 leaves the sweepline. The node can be removed (pruned) as explained previously with respect to FIGS. 7A, 7B, and 7C.

As further shown in FIG. 14B, the guide arc 902 that was previously formed between nodes N4 and N5 (i.e., the N4-N5 guide arc, see FIG. 10B) is removed. The N4-N5 guide arc is removed because the node N5 and the node N4 now have a direct path via the nodes N14, N15. In other words, there is no longer an "open" between node N4 and N5 and a guide arc is not required. While removing guide arcs is shown with respect to the N4-N5 guide arc for ease of discussion, other guide arcs can be similarly removed when the respective open condition is no longer valid (i.e., a true path becomes available between the relevant nodes).

FIG. 14C depicts the connected components 812 after the sweepline events at the position L7. As shown in FIG. 14C, no new components are added.

As discussed previously, in some embodiments of the invention, the net (e.g., net 802) is an unrouted net. In some embodiments of the invention, the respective connectivity graph (e.g., the connectivity graph 808), also referred to as a spanning graph, defines the basis of a routing plan for the net. FIG. 15A depicts an example connectivity graph 1502 formed according to one or more embodiments. In some embodiments of the invention, a minimum spanning tree is built from the connectivity graph. FIG. 15B depicts a minimum spanning tree 1504 formed by removing guide edges from the connectivity graph 1502. The guide edges can be removed using known processes, such as, for example, Delaunay triangulation.

In some embodiments of the invention, the minimum spanning tree 1504 is used to route the net (e.g., the net 802). In some embodiments of the invention, the final routing for the net is incorporated within the physical layout of a circuit design for an integrated circuit. In some embodiments of the invention, the resultant integrated circuit can be fabricated according to known processes that are generally described with reference to FIGS. 2 and 3.

Figure 16:
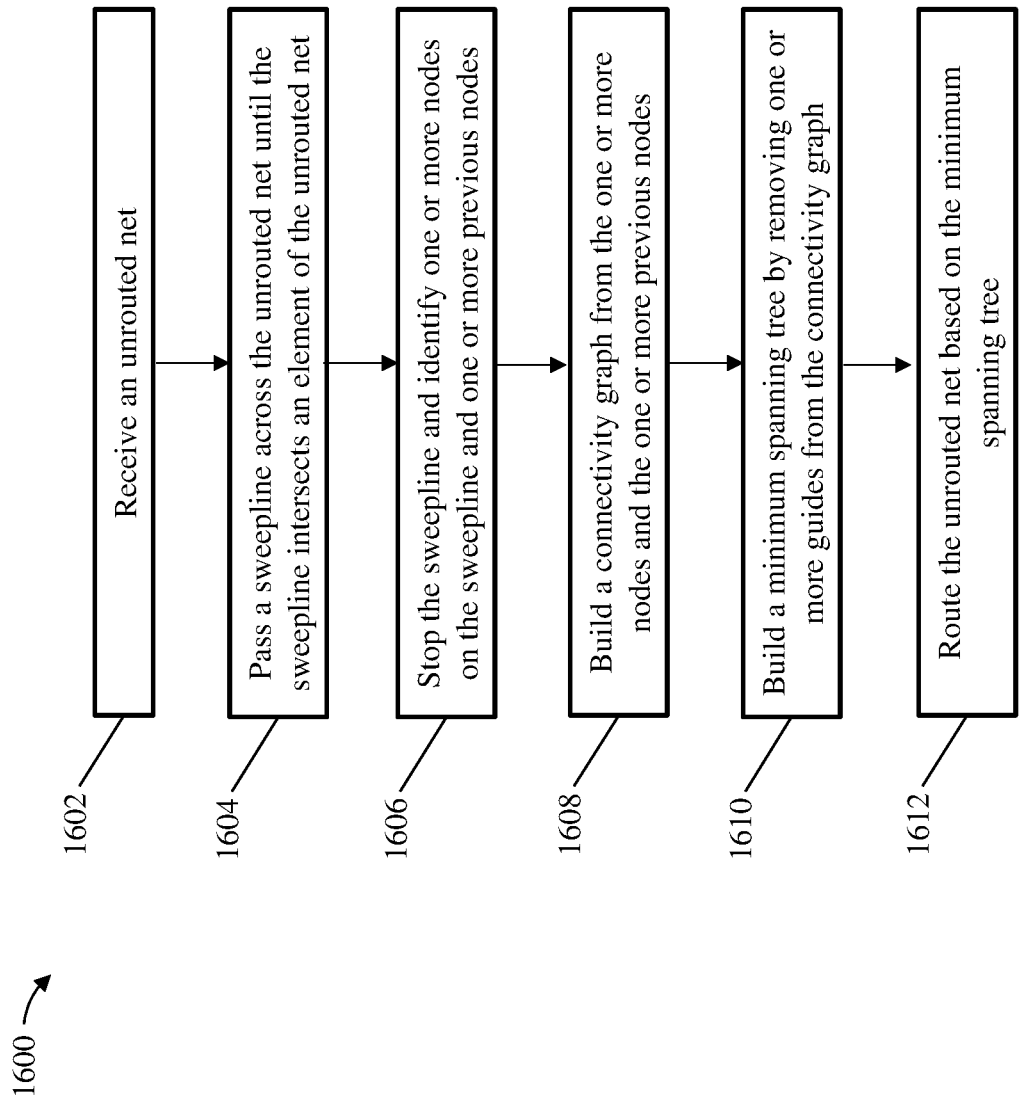
FIG. 16 is a flowchart in accordance with one or more embodiments of the present invention.

Referring now to FIG. 16, a flowchart 1600 for providing a sweepline triangulation technique to optimize spanning graphs for circuit routing is generally shown according to an embodiment. The flowchart 1600 is described in reference to FIGS. 1-15B and may include additional blocks not depicted in FIG. 16. Although depicted in a particular order, the blocks depicted in FIG. 16 can be rearranged, subdivided, and/or combined.

At block 1602, an unrouted net is received. In some embodiments of the invention, the unrouted net includes a plurality of elements. In some embodiments of the invention, the elements include pins, vias, and wires.

At block 1604, a sweepline is passed across the unrouted net until the sweepline intersects an element of the plurality of elements. At block 1606, in response to the sweepline intersecting the element, the sweepline is stopped and one or more nodes on the sweepline and one or more previous nodes are identified. In some embodiments of the invention, the previous nodes correspond to a previous location of the sweepline.

At block 1608, a connectivity graph is built from the one or more nodes and the one or more previous nodes. In some embodiments of the invention, the connectivity graph includes one or more arcs and one or more guides. In some embodiments of the invention, a guide represents an open between a first node and a second node in the connectivity graph. In some embodiments of the invention, an arc is created between two adjacent nodes of a wire segment and between a top pad and a bottom pad of a via.

At block 1610, a minimum spanning tree is built by removing one or more guides from the connectivity graph. At block 1612, the unrouted net is routed based on the minimum spanning tree.

The method can include, for each node on the sweepline, defining an upper sweepline triangle and a lower sweepline triangle. In some embodiments of the invention, each previous node in the upper sweepline triangle is tagged with a first indicator. In some embodiments of the invention, each previous node in the lower sweepline triangle is tagged with a second indicator. In some embodiments of the invention, any node with both the first indicator and the second indicator is removed.

In some embodiments of the invention, the sweepline intersects the element at a first location. In some embodiments of the invention, the sweepline is passed to one or more second location(s).

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 17:
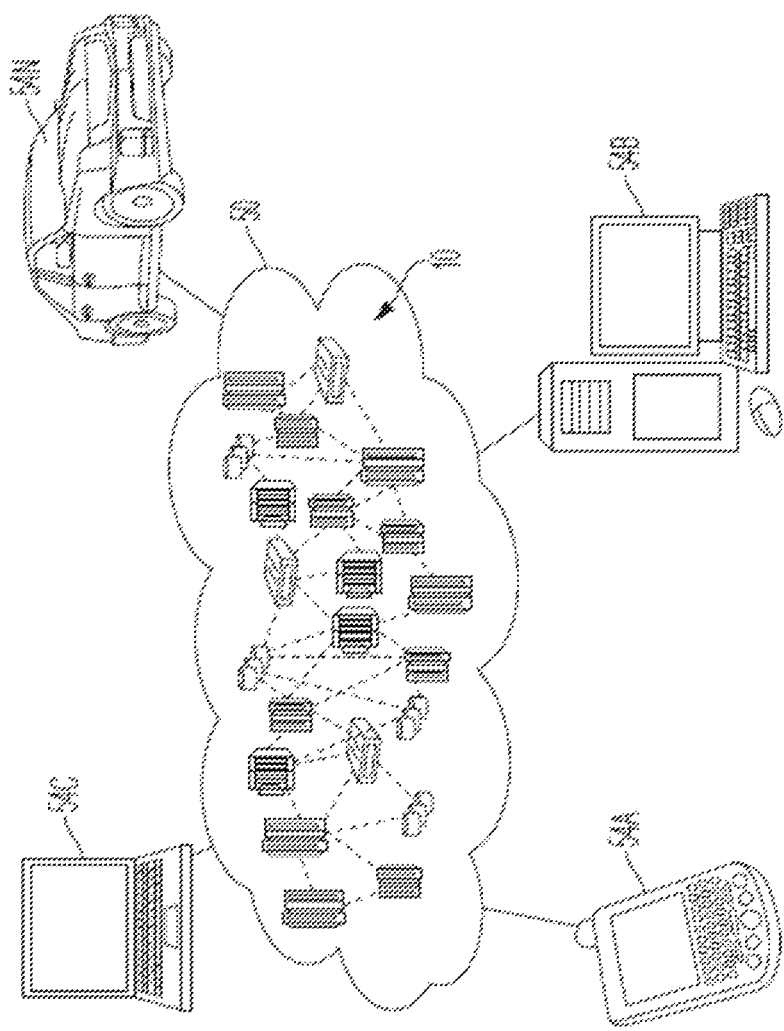
FIG. 17 depicts a cloud computing environment according to one or more embodiments of the present invention.

Referring now to FIG. 17, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described herein above, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 17 are intended to be illustrative only and that computing nodes 10 and cloud computing environment 50 can communicate with any type of computerized device over any type of network and/or network addressable connection (e.g., using a web browser).

Figure 18:
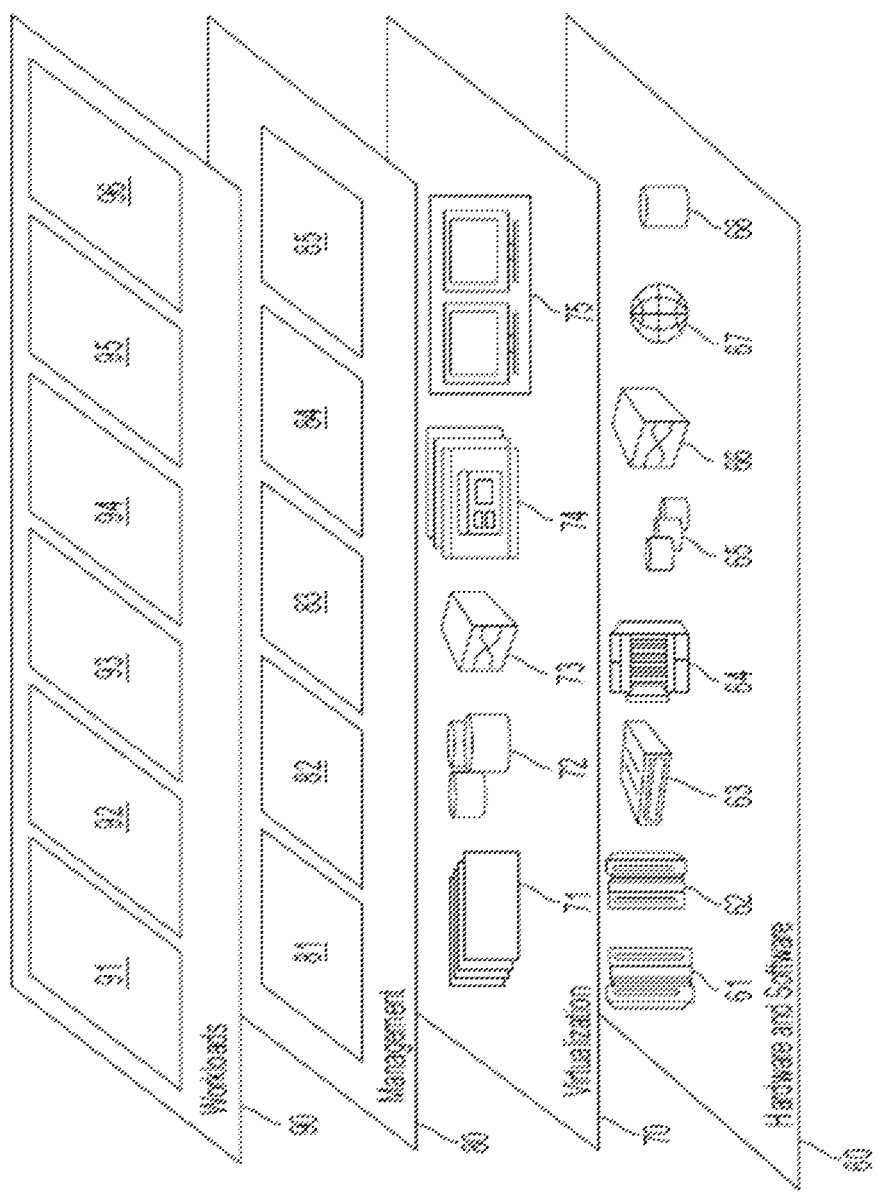
FIG. 18 depicts abstraction model layers according to one or more embodiments of the present invention.

Referring now to FIG. 18, a set of functional abstraction layers provided by cloud computing environment 50 (FIG. 17) is shown. It should be understood in advance that the components, layers, and functions shown in FIG. 18 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and software applications 96 (e.g., software running sweepline triangulation modules according to one or more embodiments), etc. Also, software applications can function with and/or be integrated with Resource provisioning 81.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for circuit routing, the method comprising:
    receiving an unrouted net comprising a plurality of elements, wherein the elements comprise pins, vias, and wires;
    passing a sweepline across the unrouted net until the sweepline intersects an element of the plurality of elements;
    in response to the sweepline intersecting the element, stopping the sweepline and identifying one or more nodes on the sweepline and one or more previous nodes;

building a connectivity graph from the one or more nodes and the one or more previous nodes, the connectivity graph comprising one or more arcs and one or more guides;

building a minimum spanning tree by removing one or more guides from the connectivity graph; and routing the unrouted net based on the minimum spanning tree.

2. The computer-implemented method of claim 1 further comprising, for each node on the sweepline:

defining an upper sweepline triangle and a lower sweepline triangle;

tagging each previous node in the upper sweepline triangle with a first indicator; and tagging each previous node in the lower sweepline triangle with a second indicator.

3. The computer-implemented method of claim 2 further comprising removing any node with both the first indicator and the second indicator.

4. The computer-implemented method of claim 1, wherein the previous nodes correspond to a previous location of the sweepline.

5. The computer-implemented method of claim 1, wherein the sweepline intersects the element at a first location; and, further comprising, passing the sweepline to a second location.

6. The computer-implemented method of claim 1, wherein a guide represents an open between a first node and a second node in the connectivity graph.

7. The computer-implemented method of claim 1, wherein an arc is created between two adjacent nodes of a wire segment and between a top pad and a bottom pad of a via.

8. A system comprising a memory having computer readable instructions and one or more processors for executing the computer readable instructions, the computer readable instructions controlling the one or more processors to perform operations comprising:

receiving an unrouted net comprising a plurality of elements, wherein the elements comprise pins, vias, and wires;

passing a sweepline across the unrouted net until the sweepline intersects an element of the plurality of elements;

in response to the sweepline intersecting the element, stopping the sweepline and identifying one or more nodes on the sweepline and one or more previous nodes;

building a connectivity graph from the one or more nodes and the one or more previous nodes, the connectivity graph comprising one or more arcs and one or more guides;

building a minimum spanning tree by removing one or more guides from the connectivity graph; and routing the unrouted net based on the minimum spanning tree.

9. The system of claim 8 further comprising, for each node on the sweepline:

defining an upper sweepline triangle and a lower sweepline triangle;

tagging each previous node in the upper sweepline triangle with a first indicator; and tagging each previous node in the lower sweepline triangle with a second indicator.

10. The system of claim 9 further comprising removing any node with both the first indicator and the second indicator.

11. The system of claim 8, wherein the previous nodes correspond to a previous location of the sweepline.

12. The system of claim 8, wherein the sweepline intersects the element at a first location; and, further comprising, passing the sweepline to a second location.

13. The system of claim 8, wherein a guide represents an open between a first node and a second node in the connectivity graph.

14. The system of claim 8, wherein an arc is created between two adjacent nodes of a wire segment and between a top pad and a bottom pad of a via.

15. A computer program product comprising a computer readable storage medium having program instructions embodied therewith, the program instructions executable by one or more processors to cause the one or more processors to perform operations comprising:

receiving an unrouted net comprising a plurality of elements, wherein the elements comprise pins, vias, and wires;

passing a sweepline across the unrouted net until the sweepline intersects an element of the plurality of elements;

in response to the sweepline intersecting the element, stopping the sweepline and identifying one or more nodes on the sweepline and one or more previous nodes;

building a connectivity graph from the one or more nodes and the one or more previous nodes, the connectivity graph comprising one or more arcs and one or more guides;

building a minimum spanning tree by removing one or more guides from the connectivity graph; and routing the unrouted net based on the minimum spanning tree.

16. The computer program product of claim 15 further comprising, for each node on the sweepline:

defining an upper sweepline triangle and a lower sweepline triangle;

tagging each previous node in the upper sweepline triangle with a first indicator; and tagging each previous node in the lower sweepline triangle with a second indicator.

17. The computer program product of claim 16 further comprising removing any node with both the first indicator and the second indicator.

18. The computer program product of claim 15, wherein the previous nodes correspond to a previous location of the sweepline.

19. The computer program product of claim 15, wherein the sweepline intersects the element at a first location; and, further comprising, passing the sweepline to a second location.

20. The computer program product of claim 15, wherein a guide represents an open between a first node and a second node in the connectivity graph.

* * * * *